United States Patent
Ikai et al.

(10) Patent No.: US 6,193,910 B1
(45) Date of Patent: Feb. 27, 2001

(54) PASTE FOR THROUGH-HOLE FILLING AND PRINTED WIRING BOARD USING THE SAME

(75) Inventors: Norihiko Ikai, Komaki; Hiroshi Sumi, Ichinomiya; Masahiko Okuyama, Nagoya; Toshifumi Kojima, Komaki, all of (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 09/190,363

(22) Filed: Nov. 12, 1998

(30) Foreign Application Priority Data

| Nov. 11, 1997 | (JP) | 9-327103 |
| Nov. 11, 1997 | (JP) | 9-327104 |
| Dec. 22, 1997 | (JP) | 9-365722 |
| Feb. 6, 1998 | (JP) | 10-41287 |
| Feb. 27, 1998 | (JP) | 10-64390 |

(51) Int. Cl.$^7$ .................................................. H01B 1/22
(52) U.S. Cl. ..................... 252/512; 523/442; 523/457; 523/458; 523/459
(58) Field of Search ............................ 523/442, 457, 523/458, 459; 252/512; 148/24

(56) References Cited

U.S. PATENT DOCUMENTS

| 4,789,411 | * | 12/1988 | Eguchi et al. | 148/24 |
| 5,061,779 | | 10/1991 | Wang | 528/98 |
| 5,102,970 | | 4/1992 | Wang | 528/98 |
| 5,204,025 | * | 4/1993 | Yamada et al. | 252/500 |
| 5,683,627 | * | 11/1997 | Katayama et al. | 252/512 |

FOREIGN PATENT DOCUMENTS

| 53-123868 | 10/1978 | (JP) | H05K/3/00 |
| 57-176797 | 10/1982 | (JP) | H05K/3/46 |
| 62-224996 | 10/1987 | (JP) | H05K/3/06 |
| 63-137499 | 6/1988 | (JP) | H05K/3/46 |
| 4-27194 | 1/1992 | (JP) | H05K/3/46 |
| 5-28919 | 4/1993 | (JP) | H05K/3/06 |
| 7-14427 | 1/1995 | (JP) | H01B/1/22 |
| 8-21254 | 3/1996 | (JP) | H01B/1/00 |
| 8-83971 | 3/1996 | (JP) | H05K/3/28 |
| 8-311157 | 11/1996 | (JP) | C08G/59/20 |

* cited by examiner

*Primary Examiner*—Robert Dawson
*Assistant Examiner*—D. Aylward
(74) *Attorney, Agent, or Firm*—Sughrue, Mion, Zinn, Macpeak & Seas, PLLC

(57) ABSTRACT

A paste for filling through-holes of a printed wiring board contains 100 parts by weight of an epoxy resin composition containing 90 to 99.5 parts by weight of an epoxy resin and 0.5 to 10 parts by weight of a curing agent; and (B) 500 to 1000 parts by weight of a metallic filler having an average particle size of 0.5 to 20 μm. The paste has a viscosity of not higher than 20,000 poise at 25° C. and a volatile content of not more than 1.0% when heated in a filling step. The paste exhibits such shrink-resistance properties that when a first cured resin obtained by heating in a filling step is re-heated and cooled in a solder reflow step to obtain a second cured resin, the shrinkage percentage of the first cured resin to the second cured resin in the longitudinal direction of the through-hole is not greater than 0.1%.

32 Claims, 3 Drawing Sheets

PASTE FOR THROUGH-HOLE FILLING AND PRINTED WIRING BOARD USING THE SAME

BACKGROUND OF THE INVENTION

1. Field of the Invention

This invention relates to a paste for filling through-holes of a printed wiring board and a printed wiring board produced by using the same. The paste of the present invention is useful in high-density printed wiring boards, especially multilayer printed wiring boards, and can be used in various printed wiring boards for information communication which are exposed to severe conditions, such as an IC package for MPU.

2. Description of the Related Art

The upper and lower wiring layers of printed wiring boards (hereinafter abbreviated as PWB) and copper-clad laminates having through-holes are electrically connected by plating the inner wall of the through-holes with metal to form a conductor layer, and the through-holes are filled with a paste. PWBs having such through-holes are disclosed, e.g., in JP-A-62-224996 (the term "JP-A" as used herein means an "Unexamined Japanese Patent Publication") and JP-A-63-137499. These wiring boards, etc. with through-holes are chiefly for general use, having found little use in IC packages for MPU that are required to be highly reliable. Ceramic wiring boards, etc. are usually used in the latter field.

In recent years, however, PWB and laminate boards having through-holes have been extending their use in IC packages for MPU in order to cope with growing demands for increasing the wiring density and the number of wiring layers to be laminated. Where a chip is mounted on an IC package for MPU with its through-holes filled with a conventional paste for general use, cracks 51 tend to develop in a built-up layer 5 on the through-hole 2 as shown in FIG. 5. Such crack development in a built-up layer is generally considered attributable to the difference in thermal expansion between a wiring board 1 and a paste 4.

The inventors have tested a number of pastes having a varied coefficient of thermal expansion but failed to inhibit crack development in a built-up layer. Thinking that the cause of cracking lies in something else, the inventors conducted extensive investigations. As a result, it has been found that the crack development is caused by shrinkage of a hardened paste in a through-hole. That is, they have found that a hardened product of a paste obtained in a filling step undergoes shrinkage on further hardening in a solder reflow step, and the shrinkage remains after cooling to generate a tensile stress in the thickness direction of the built-up layer. Hereinafter the product obtained by hardening a paste in a filling step will be referred to as a first cured resin or a first curing product, and the further hardened product resulting from heating the first cured resin in a solder reflow step will be referred to as a second cured resin or a second curing product.

In order to improve performance of electronic equipment from the aspect of PWB, studies have been given to application of a photolithographic technique for achieving high-density wiring and a build-up process for making a multilayer wiring structure. Where a conventional PWB having through-holes is used, wiring cannot be formed on the opening of through-holes, and the circuit design has restrictions such that the circuit must take a circuitous route, which has been a bar to achievement of high-density wiring and multilayer wiring structure.

To achieve high-density wiring and an increased number of built-up layers while overcoming the above problem, a method comprising filling a through-hole 2 of a PWB 1 with a resin paste 10 and forming wiring even on the through-hole and further building up an insulating layer 6 has recently been developed and is attracting attention (see FIG. 3). The resin paste used contains a filler 5, usually an inorganic filler such as silica, to suppress thermal shrinkage on curing (see JP-A-2-284951). Further, the inner wall of the through-hole 2 is plated to form a copper deposit layer 3 for electrically connecting the upper and lower wiring layers (see JP-B-5-28919). In such a PWB structure, where wiring is made by an additive process and an insulating layer is built-up thereon, a via-hole 7 cannot be formed on the through-hole 2 and should be made aside from the through-hole 2 as illustrated in FIG. 3.

It has now come to necessary to form via-holes on through-holes so as to satisfy the ever-increasing demands for high-density wiring and a multilayer structure. To realize this, copper should be deposited on through-holes, too. However, a conventional paste comprising a resin and an inorganic filler such as silica has poor adhesion to a copper deposit layer formed thereon after it is stuffed into through-holes and cured. As a result, as shown in FIG. 4, the copper deposit layer 3 tends to separate from the cured resin or undergo blistering to produce a void 32 between the copper deposit layer 3 and the cured resin. Besides, the adhesion between the resin and the inorganic filler particles is also insufficient, which tends to result in formation of air bubbles in the cured resin.

On the other hand, a conductive paste comprising a resin and a metallic filler, such as copper or silver, has been proposed (see JP-A-8-311157, JP-A-7-14427, JP-B-8-21254 (the term "JP-B" as used herein means an "Examined Japanese Patent Publication"). While the conductive paste offers improvement in adhesion between a cured resin and a copper deposit layer, it still fails to sufficiently inhibit separation and blistering of the copper deposit layer on through-holes, and the problem remains particularly for uses where high reliability is required under severe conditions. In addition, cases sometimes occurs in which the cured resin separates from the copper deposit layer formed on the inner wall of through-holes to make gaps.

Moreover, the conductive paste containing a metallic filler, while achieving improved adhesion to a copper deposit layer, has lower flowability than a resin paste containing an inorganic filler such as silica. Therefore where through-holes are filled with the conductive paste by screen printing or a like technique under the same conditions as adopted to an inorganic filler-containing paste, resin starvation may tend to occur. While not clear, the resin starvation seems attributed to greater friction among metallic filler particles than among inorganic filler particles such as silica due to some action, for example, of mechanical properties or surface energy.

Addition of a reactive or non-reactive diluent to the metallic filler-containing paste could decrease the viscosity and thereby increase the flowability. However, addition of a reactive diluent tends to result in reduction of heat resistance of the paste or crack development in a built-up layer. Where a non-reactive diluent is added, the paste tends to largely shrink on curing, which will result in separation from the copper deposit layer formed on the inner wall of through-holes to make a gap. In some cases the copper deposit layer formed on through-holes may peel or blister.

Cracking in a built-up layer as referred to above can take place irrespective of whether the paste contains a metallic filler or an inorganic filler. As previously elucidated, the cracking in a built-up layer is due to a tensile stress generated in the thickness direction of the built-up layer by shrinkage of once cured resin in a solder reflow step. Cases are also met with depending on the composition of the paste, particularly the composition of the matrix resin, in which the first cured resin becomes harder and brittle in the solder reflow step and suffers cracks. Cracks in this second cured resin can also develop in reliability tests, such as a cycling test.

The PWB having through-holes is basically produced through the following procedure.

Through-holes are pierced through an insulating substrate or a copper-clad laminate, and the entire surface of the substrate inclusive of the inner wall of the through-holes is plated electrolessly to form a copper deposit layer. A resist layer is then formed thereon, exposed to light, and developed to form a wiring pattern. The wiring area and the inner wall of the through-holes are plated with metal to a prescribed deposit thickness. The resist layer is stripped, and an unnecessary area of the metal deposit layer is removed by etching to form a circuit.

Then the through-holes are filled with an insulating paste by screen printing, etc., and the paste is heated to cure to obtain a PWB. The insulating paste frequently used comprises a heat-resistant epoxy resin and an inorganic filler so as to have a minimum difference in thermal expansion from the wiring substrate. An insulating layer called a built-up layer and a wiring layer are then successively formed thereon by a known build-up process to produce a multilayer PWB (ML-PWB).

Electronic elements such as an IC chip are mounted on the ML-PWB thus produced in a solder reflow step, in which the ML-PWB is heated at about 270° C. for about 10 minutes in a solder reflow oven, followed by cooling to room temperature. In this cooling stage or subsequent reliability tests, cracks are liable to develop in the built-up layer laminated on the through-holes. Such crack development in a build-up layer is generally accepted to be attributable to the difference in thermal expansion between the wiring board and the paste.

The inventors of the present invention tested various kinds of pastes having a small difference in thermal expansion from the wiring board but failed to inhibit crack development. Further, where the curing temperature of the resin paste in a filling step is too high, there arises a problem that the cured resin itself after a solder reflow step suffers cracks through the thermal history during reliability tests, such as a cycling test, which are carried out in a simulation of the working environment of the equipment in which the PWB is incorporated.

SUMMARY OF THE INVENTION

Accordingly, an object of the present invention is to provide a paste for filling through-holes which, after curing, exhibits excellent adhesion to a copper deposit layer formed over the through-holes and does not cause the copper deposit layer to peel or blister; and a PWB using the same. The paste meeting this object is effective in sufficiently suppressing separation between a cured paste resin and a copper deposit layer formed on the inner wall of the through-holes and crack development in a built-up layer during a solder reflow step. Therefore the paste is applicable even to those PWBs which are required to assure high reliability under severe conditions of use.

Another object of the present invention is to provide a paste for filling through-holes which contains both a metallic filler and an inorganic filler such as silica and therefore exhibits sufficient flowability for filling through-holes. The paste meeting this object can contain fillers in a larger proportion compared with pastes containing a metallic filler alone. Therefore a water absorption of the first cured resin can be reduced, and shrinkage of the second cured resin on cooling in a solder reflow step can be minimized. Separation of the first cured resin from a copper deposit layer formed on the inner wall of through-holes is also controlled sufficiently. Accordingly, the paste is applicable even to those PWBs which are required to assure high reliability under severe conditions of use.

A still another object of the present invention is to provide a paste for filling through-holes which, after first curing in a filling step, is prevented from further shrinking on heating and cooling in a solder reflow step so that crack development in a built-up layer can be prevented satisfactorily; and a paste for filling through-holes which comprises a specific epoxy resin and has a low viscosity, excellent flowability, and a small water absorption. The paste meeting this object can easily be stuffed into through-holes without causing resin starvation and suppresses crack development in a built-up layer satisfactorily.

A still another object of the present invention is to provide a paste for filling through-holes which is effective in suppressing crack development in a built-up layer when it is heated to cure and then subjected to a surface mounting step in a solder reflow oven, etc. where it is re-heated to a relatively high temperature, followed by cooling; and a PWB using the same. The paste meeting this object is also effective in preventing crack development in the second cured resin itself in reliability tests after mounting, such as a cycling test, which are carried out in a simulation of the working environment of the equipment in which the PWB is incorporated.

The present invention provides a paste for filling through-holes of a printed wiring board comprising: (A) 100 parts by weight of an epoxy resin composition containing 90 to 99.5 parts by weight of an epoxy resin and 0.5 to 10 parts by weight of a curing agent; and (B) 500 to 1000 parts by weight of a metallic filler having an average particle size of 0.5 to 20 μm; wherein the paste has a viscosity of not higher than 20,000 poise at 25° C. and a volatile content of not more than 1.0% when heated in a filling step; and the paste exhibiting such shrink-resistance properties that when a first cured resin obtained by heating in a filling step is re-heated and cooled in a solder reflow step to obtain a second cured resin, the shrinkage percentage of said first cured resin to the second cured resin in the longitudinal direction of the through-hole being not greater than 0.1%.

The present invention further provides a paste for filling through-holes of a printed wiring board comprising: (A) 100 parts by weight of an epoxy resin composition comprising 90 to 99.5 parts by weight of an epoxy resin and 0.5 to 10 parts by weight of a curing agent; and (B) 500 to 1000 parts by weight of a metallic filler having an average particle size of 0.5 to 20 μm; wherein the paste having a viscosity of not higher than 20,000 poise at 25° C. and a volatile content of not more than 1.0% when heated in a filling step; and the paste exhibits such shrink-resistance properties that when a 5-mm wide test piece which is prepared by making a 100 μm-thick film of the paste and curing the film by heating at 150° C. for 5 hours is heated at a starting temperature of 23° C. up to 270° C. and then cooled to 23° C. under a load of 5 g applied in the longitudinal direction of the test piece, the shrinkage percentage of the test piece in the longitudinal direction is not greater than 0.1%, the shrinkage percentage being calculated according to equation:

Shrinkage percentage (%)=[(length of test piece at 23° C. before being heated to 270° C.)−(length of test piece after being once heated to 270° C. and then cooled to 23° C.)]/(length of test piece at 23° C. before being heated to 270° C.)×100.

The present invention further provides a paste for filling through-holes of a printed wiring board comprising: (A) 100 parts by weight of an epoxy resin composition containing 90 to 99.5 parts by weight of an epoxy resin and 0.5 to 10 parts by weight of a curing agent; (B) 100 to 1000 parts by weight of a metallic filler; and (C) 10 to 900 parts by weight of an inorganic filler; wherein the paste having a viscosity of not higher than 20,000 poise at 25° C. and a volatile content of not more than 1.0% when heated in a filling step; and the paste exhibits such shrink-resistance properties that when a first cured resin obtained by heating in a filling step is re-heated and cooled in a solder reflow step to obtain a second cured resin, the shrinkage percentage of the first cured resin to the second cured resin in the longitudinal direction of the through-hole being not greater than 0.1%.

The present invention still further provides a paste for filling through-holes of a printed wiring board comprising: (A) 100 parts by weight of an epoxy resin composition containing 90 to 99.5 parts by weight of an epoxy resin and 0.5 to 10 parts by weight of a curing agent; (B) 100 to 1000 parts by weight of a metallic filler; and (C) 10 to 900 parts by weight of an inorganic filler; wherein the paste having a viscosity of not higher than 20,000 poise at 25° C. and a volatile content of not more than 1.0% when heated in a filling step, and the paste exhibits such shrink-resistance properties that when a 5-mm wide test piece which is prepared by making a 100 μm-thick film of the paste and curing the film by heating at 150° C. for 5 hours is heated at a starting temperature of 23° C. up to 270° C. and then cooled to 23° C. under a load of 5 g applied in the longitudinal direction of the test piece, the shrinkage percentage of the test piece in the longitudinal direction is not greater than 0.1%, the shrinkage percentage being calculated according to equation:

Shrinkage percentage (%)=[(length of test piece at 23° C. before being heated to 270° C.)−(length of test piece after being once heated to 270° C. and then cooled to 23° C.)]/(length of test piece at 23° C. before being heated to 270° C.)×100.

The present invention provides a paste for filling through-holes of a printed wiring board comprising (A) an epoxy resin composition comprising an epoxy resin and a curing agent; and (B) a filler; wherein the epoxy resin contains an amine type epoxy resin.

The present invention provides a paste for filling through-holes of a printed wiring board which has such shrink-resistance properties that when a first cured product thereof obtained by heating in a filling step is re-heated and cooled in a solder reflow step to obtain a second cured product, the shrinkage percentage of the first cured product to the second cured product in the longitudinal direction of the through-hole being not greater than 0.1%.

The present invention provides a paste for filling through-holes of a printed wiring board which has such shrink-resistance properties that when a 5-mm wide test piece which is prepared by making a 100 μm-thick film of the paste and curing the film by heating at 150° C. for 5 hours is heated at a starting temperature of 23° C. up to 270° C. and then cooled to 23° C. under a load of 5 g applied in the longitudinal direction of the test piece, the shrinkage percentage of the test piece in the longitudinal direction is not greater than 0.1%, the shrinkage percentage being calculated according to equation:

Shrinkage percentage (%)=[(length of test piece at 23° C. before being heated to 270° C.)−(length of test piece after being once heated to 270° C. and then cooled to 23° C.)]/(length of test piece at 23° C. before being heated to 270° C.)×100.

DETAILED DESCRIPTION OF THE INVENTION

Figure 1:
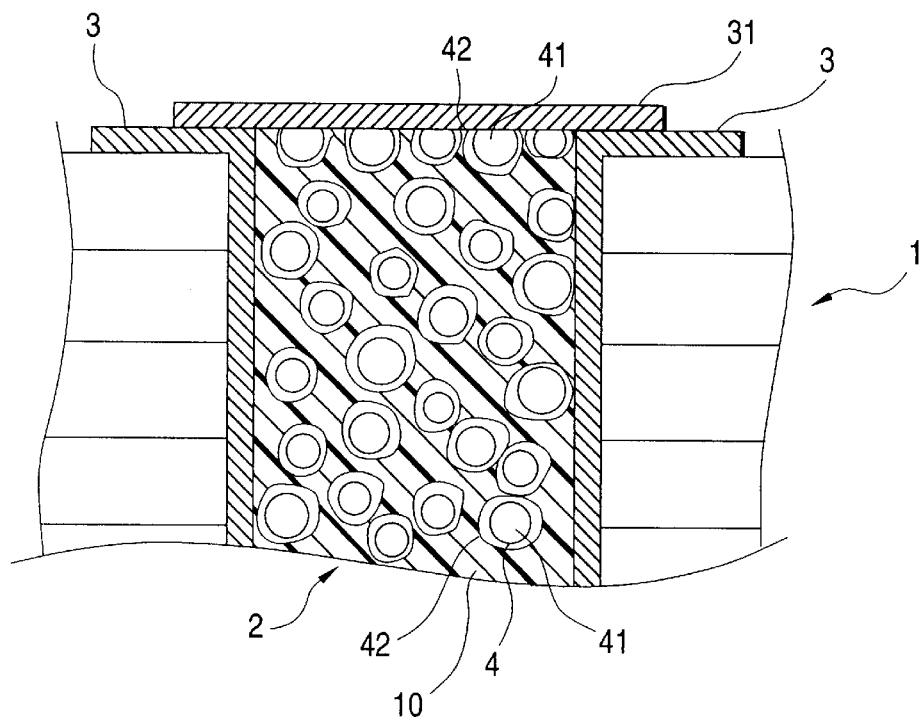
FIG. 1 is a schematic cross section of a PWB showing the state of copper particles in a first cured resin in a through-hole particularly in the vicinities of the end of the through-hole, the copper particles having been subjected to a blackening treatment to have a rough surface.

Detailed description of the present invention will be described as follows.

The paste for through-hole filling according to a first embodiment of the present invention contains (A) 100 parts by weight of an epoxy resin composition including 90 to 99.5 parts by weight of an epoxy resin and 0.5 to 10 parts by weight of a curing agent and (B) 500 to 1000 parts by weight of a metallic filler having an average particle size of 0.5 to 20 μm, the paste having a viscosity of not higher than 20,000 poise at 25° C. and a volatile content of not more than 1.0% when heated in a filling step, and the paste exhibiting such shrink-resistance properties that when a first cured resin obtained by heating in a filling step is re-heated and cooled in a solder reflow step to obtain a second cured resin, the shrinkage percentage of the first cured resin to the second cured resin in the longitudinal direction of the through-hole is not greater than 0.1%.

The shrinkage percentage of the cured resin as referred to above is represented by the following equation (1):

Shrinkage percentage (%)=[(dimension of first cured resin in the longitudinal direction of through-hole)−(dimension of second cured resin in the longitudinal direction of through-hole)]/(dimension of first cured resin in the longitudinal direction of through-hole)×100      (1)

The paste of the first embodiment has a viscosity of not higher than 20,000 poise, preferably 15,000 poise or lower, still preferably from 500 to 10,000 poise, measured at 25° C. If the viscosity exceeds 20,000 poise, the workability in filling through-holes with the paste is considerably reduced. The viscosity of the paste according to the present invention is measured with a rotating spindle viscometer, etc.

The volatile content of the paste in a filling step is not more than 1.0%, preferably 0.2% or less. If the volatile content exceeds 1.0%, the copper deposit layer formed on through-holes undergoes peeling and blistering in reliability tests, etc., and air bubbles tend to occur in the first cured resin. Further, the first cured resin may tend to separate from the copper deposit layer formed on the inner wall of through-holes to produce a gap. The volatile content of the paste is measured by differential thermal analysis-thermogravimetric analysis (DTA-TG), etc.

If the shrinkage percentage of the first cured resin on re-heating and cooling in a solder reflow step exceeds 0.1%, cracking tends to occur in a built-up layer after the cooling or in reliability tests, etc. The shrinkage percentage can be calculated from the readings of the chart of thermomechanical analysis (TMA).

In order to prevent peeling and blistering of a copper deposit layer, gap formation in through-holes, and cracking in a built-up layer, the present invention teaches, in its first aspect, using a paste for through-hole filling which contains a resin that hardly shrinks on curing and contains a metallic filler in a particularly high proportion. As the paste does not need a volatile solvent, there is generated little volatile matter on curing in the filling step, whereby formation of air bubbles in the first cured resin is suppressed.

The metallic filler used includes copper particles, silver particles, and a mixture thereof. If the average particle size of the metallic filler is smaller than 0.5 μm, the adhesion of the first cured resin to a copper deposit layer is diminished. If the average particle size is greater than 20 μm, separation between the first cured resin and a copper deposit layer also occurs, tending to cause the copper deposit layer to blister. If the amount of the metallic filler in the paste is less than 500 parts by weight, the first cured resin will have an increased water absorption, and the shrinkage of the first cured resin in a solder reflow step will increase to cause cracking in a built-up layer. If the amount of the metallic filler is more than 1000 parts by weight, the paste has an increased viscosity to reduce the workability in filling through-holes.

A preferred average particle size of the metallic filler is from 3 to 15 μm, particularly from 5 to 10 μm. A particularly preferred proportion of the metallic filler is from 500 to 800 parts by weight. With the average particle size and the proportion of the metallic filler falling within these preferred ranges, the adhesive strength of the first cured resin to a copper deposit layer is further enhanced, and crack development in a built-up layer in a solder reflow step is prevented sufficiently.

Of metallic fillers copper particles are preferred for their excellent affinity to deposited copper. While copper particles as a filler can be spherical, flaky, dendritic, etc., the shape of the particles is not particularly limited as long as the resulting paste has a viscosity of 20,000 poise or less at 25° C. In order to control an increase of viscosity of the paste when the filler is added in a large quantity, it is preferred to use filler particles at least a half (weight) of which are spherical.

It is still preferred to use soft-etched copper particles or, as a feature of a second embodiment of the present invention, copper particles having been subjected to a blackening treatment. Where copper particles are subjected to a blackening treatment, a prickly film of copper oxide is formed on the surface of the particles. The particles having its surface thus roughened show an anchor effect and improved chemical affinity to the matrix resin to achieve enhanced adhesion to the resin. As a result, formation of air bubbles in the first cured resin can be prevented, and the adhesion of the cured resin to a copper deposit layer is improved.

The affinity of the metallic filler to the epoxy resin can also be improved by treating the filler particles with a silane coupling agent having an epoxy group, which features a 3rd embodiment of the present invention. In particular, treatment with an epoxysilane having an epoxy group on the hydrophobic side thereof is also effective in reducing the water absorption of the first cured resin.

An epoxy resin generally shrinks less than other resins and is suitable for use in a paste for filling through-holes. The epoxy resin composition used in the first embodiment contains an epoxy resin and a requisite amount of a curing agent therefor. While acid anhydrides or catalyst type curing agents can be used widely as a curing agent for an epoxy resin, catalyst type curing agents, for example, imidazole curing agents are particularly preferred in order to decrease the viscosity of the paste and the water absorption of the first cured resin. A preferred proportion of the curing agent is from 2 to 7 parts by weight, particularly about 5 parts by weight, based on the epoxy resin composition.

In a 4th embodiment, the epoxy resin in the epoxy resin composition contains (1) 70 to 99 parts by weight of a phenol novolak epoxy resin and (2) 1 to 30 parts by weight of at least one of a bisphenol A epoxy resin and a bisphenol F epoxy resin per 100 parts by weight of the total amount of (1) and (2). The phenol novolak epoxy resin is suited to use in a paste for filling through-holes because of its smaller shrinkage on curing and its relatively high Tg. However, a paste contains the phenol novolak epoxy resin and a filler becomes hard and brittle when cured secondarily in a solder reflow step and tends to suffer cracks through thermal history in, e.g., a cycling test given later. Therefore, it is advised in the 4th embodiment that the phenol novolak epoxy resin be blended with other epoxy resins having excellent flexibility whereby the hardness of the second cured resin is controlled to suppress crack development in the second cured resin.

The epoxy resins with excellent flexibility is selected from a bisphenol A epoxy resin and a bisphenol F epoxy resin. These bisphenol type epoxy resins generally shrink more and have a lower Tg than the phenol novolak epoxy resin but exhibit more flexibility, mostly have a relatively low viscosity at room temperature, and also have a low water absorption. Therefore, blending of the bisphenol type epoxy resin into the phenol novolak epoxy resin provides a paste that is excellent in workability in a filling step and, after secondary curing in a solder reflow step, keeps moderate hardness. Sufficient heat resistance of the epoxy resin is assured if its Tg is 125° C. or above, preferably 130° C. or above, still preferably 140° C. or above.

If the amount of the bisphenol epoxy resin is less than 1 part by weight per 100 parts by weight of the total amount of phenol novolak epoxy resin (1) and the bisphenol epoxy resin (2), the effect of the resin (2) may be insufficient, and it is likely that the second cured resin may become too hard to avoid cracking. Further, the resulting paste has a high viscosity, and it is not easy to fill through-holes with the paste. On the other hand, if the amount of the resin (2) exceeds 30 parts by weight, the first cured resin tends to shrink largely in a solder reflow step to develop cracks in a built-up layer. Additionally the heat resistance of the blended epoxy resin tends to decrease. A preferred range of the amount of the resin (2) is from 5 to 25 parts, particularly 10 to 20 parts, by weight per 100 parts by weight of the blended epoxy resin. Within this preferred range, the resulting paste is easy to stuff into through-holes and shows only a slight shrinkage in a solder reflow step.

In a 5th embodiment of the present invention, the heating temperature in a filling step preferably ranges from 120 to 170° C., and that in a solder reflow step preferably ranges from 230 to 280° C. In the filling step, the epoxy resin does not cure sufficiently at a heating temperature lower than 120° C. At temperatures above 170° C., although cracking in a built-up layer in a solder reflow step can be inhibited, the second cured resin itself tends to develop cracks in the subsequent cycling test, etc. If the heating temperature in a solder reflow step is below 230° C., it is impossible to mount IC chips, etc. on the resulting PWB. If it exceeds 280° C., the epoxy resin may tend to undergo thermal deterioration.

It is preferred for a copper deposit layer formed on the first cured resin by electroplating to have a peel strength of not less than 0.8 kgf/cm$^2$ as measured in accordance with JIS C 6481, which provides a 6th embodiment of the present invention. With this high peel strength between the first cured resin and the copper deposit layer, the copper deposit layer is sufficiently prevented from peeling and blistering. It is also preferable that the water absorption of the first cured resin be not more than 0.3%, which provides a 7th embodiment of the present invention. In this embodiment, the peel strength between the first cured resin and the copper deposit layer is enhanced to secure prevention of the copper deposit layer's peeling and blistering. The water absorption of a cured resin can be measured in accordance with JIS K 6911. The curing condition of a sample for measuring the water absorption is 150° C. and 5 hours. The water absorption is measured by the following manner. Namely, a sample is cured at 150° C. for 5 hours to produce a cured body in a film shape (length: 50 $\mu$m, width: 50 $\mu$m, thickness: 0.1 $\mu$m). The film is dried at 50° C. for 5 hours. The weight (W0) of the film is measured. The film is impregnated in distilled water for 24 hours. Water was wiped by a cloth to measure the weight (W1) of the film. The water absorption (WA) is calculated in the formula of WA=[(W1−W0)/W0]*100.

The paste for filling through-holes according to an 8th embodiment of the present invention contains (A) 100 parts by weight of an epoxy resin composition including 90 to 99.5 parts by weight of an epoxy resin and 0.5 to 10 parts by weight of a curing agent and (B) 500 to 1000 parts by weight of a metallic filler having an average particle size of 0.5 to 20 $\mu$m, the paste having a viscosity of not higher than 20,000 poise at 25° C. and a volatile content of not more than 1.0% when heated in a filling step, and the paste exhibiting such shrink-resistance properties that when a 5-mm wide test piece which is prepared by making a 100 $\mu$m-thick film of the paste and curing the film by heating at 150° C. for 5 hours is heated at a starting temperature of 23° C. up to 270° C. and then cooled to 23° C. under a load of 5 g applied in the longitudinal direction of the test piece, the shrinkage percentage of the test piece in the longitudinal direction is not greater than 0.1%. The shrinkage percentage as referred to here is calculated according to equation (2):

Shrinkage percentage (%)=[(length of test piece at 23° C. before being heated to 270° C.)−(length of test piece after being once heated to 270° C. and then cooled to 23° C.)]/(length of test piece at 23° C. before being heated to 270° C.)×100     (2)

In the 8th embodiment, the shrink-resistance properties of the paste are not evaluated based on the shrinkage of the paste as stuffed into a through-hole and cured in a filling step and again cured in a solder reflow step. However, it has been confirmed that a paste having a shrinkage percentage of 0.1% or less as determined by the manner as specified in the 8th embodiment does not cause separation or blisters of a copper deposit layer, gap formation in a through-hole, or crack development in a built-up layer when it is actually stuffed into a through-hole and cured in a filling step and then re-heated, followed by cooling in a solder reflow step. That is, what is intended by the 8th embodiment resides in that one can easily distinguish a practically useful paste from practically useless ones by such a convenient screening method. The rate of temperature rise and drop in the measurement of a shrinkage percentage is preferably 1 to 5° C./min, still preferably 1 to 3° C./min, particularly preferably 2° C./min. It is preferable that the test piece be cooled immediately after the temperature reaches 270° C.

The present invention provides, in its 9th embodiment, a PWB having through-holes filled with a heat-curing product of a paste according to any one of the 1st to 8th embodiments. In the PWB of this embodiment is sufficiently freed from problems, such as separation and blistering of a copper deposit layer, gap formation in the through-holes, air bubble formation in the first cured resin, crack development in a built-up layer in a solder reflow step, and the like. Therefore, the PWB easily achieves high density wiring and can be made up of an increased number of wiring layers. That is, the PWB can be an ML-PWB with excellent performance.

Since the paste according to the 1st to 8th embodiments of the present invention contains an epoxy resin composition containing a large quantity of a metallic filler, particularly spherical copper particles 4 shown in FIG. 1, the first cured resin in a through-hole 2 has excellent affinity to a copper deposit layer 3 that is formed on the through-hole 2. As illustrated in FIG. 1, where copper particles having their surface roughened by, for example, a blackening treatment, the adhesion of the copper particles 41 to the epoxy resin is strengthened through an anchor effect and improved chemical affinity. As a result, air bubbles are hardly generated in the first cured resin, and the adhesion of the first cured resin and a copper deposit layer formed on the inner wall of the through-hole is also enhanced. In FIG. 1, the copper particles 41 have an oxide layer 42 formed by a blackening treatment. The oxide layer 42 does not impair the adhesion of the first cured resin to the copper deposit layer 3 because the exposed surface of the first cured resin is polished with a buff or by means of a belt sander, etc., and the surface oxide layer of the exposed copper particles is thereby abraded to make the metallic copper appear.

Where a phenol novolak epoxy resin made up of bulky and rigid molecules is used with a large quantity of the above-described metallic filler according to the 4th embodiment, the resin molecules shows limited movement on curing due to the steric hindrance, only having a small shrinkage of not more than 0.1% in a solder reflow step, and development of cracks in a built-up layer is inhibited sufficiently. The combined use of a proper amount of a bisphenol epoxy resin that is made up of linear and flexible molecules not only secures excellent workability of the paste in filling through-holes but also prevents the second cured resin from suffering cracks due to changes in temperature, etc. of the environment in which electronic equipment containing the resulting PWB is used.

Figure 2:
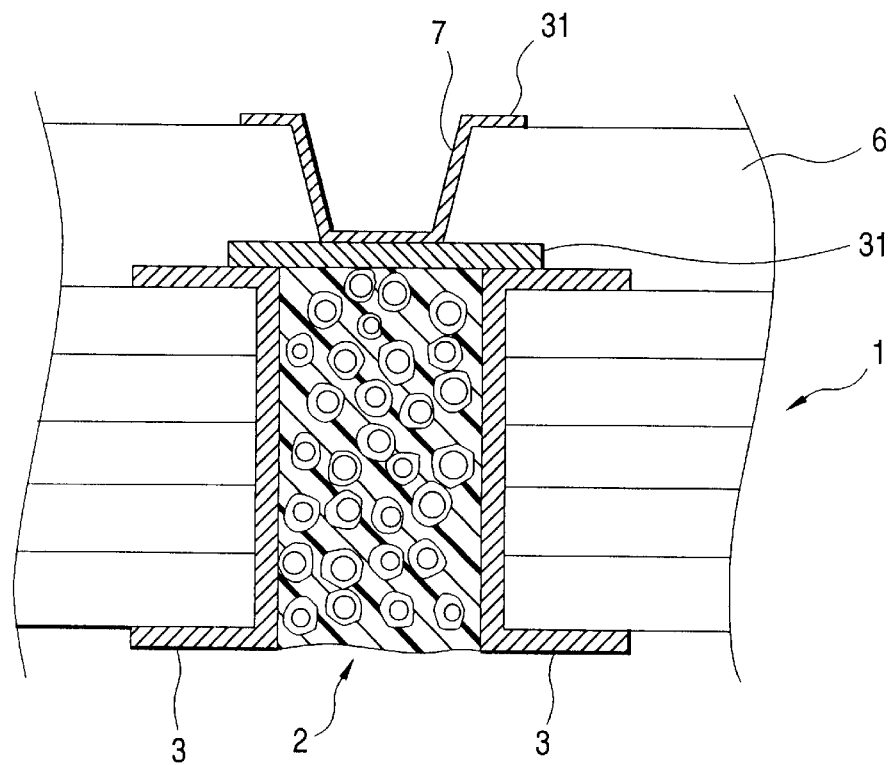
FIG. 2 is a schematic cross section of a PWB in which a built-up layer is formed on the PWB of FIG. 1, and a via-hole is made therein on the position corresponding to the through-hole.
Figure 3:
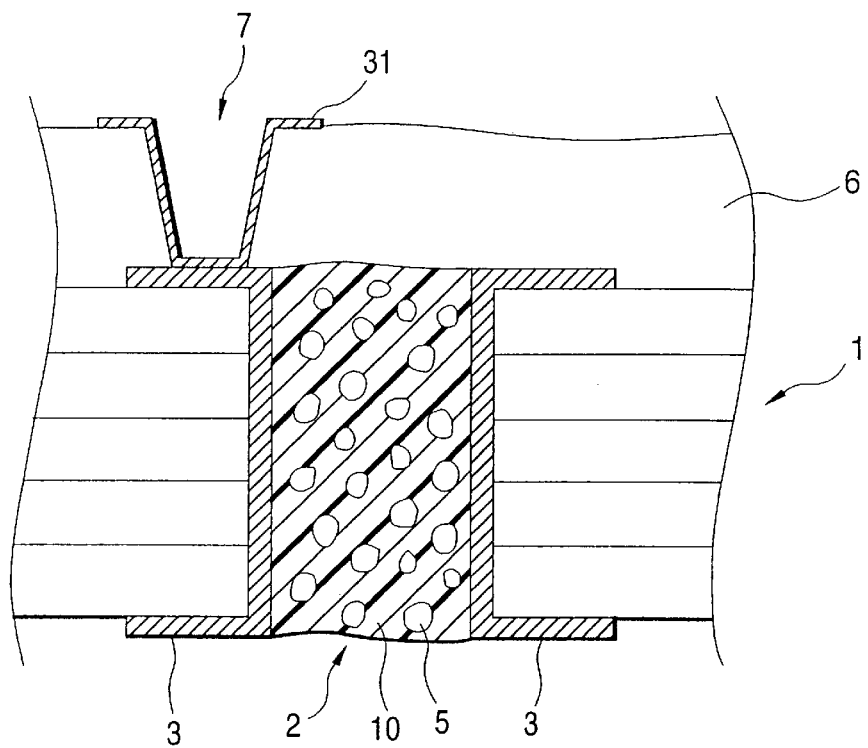
FIG. 3 is a schematic cross section of a PWB in which a via-hole is made aside from a through-hole.
Figure 4:
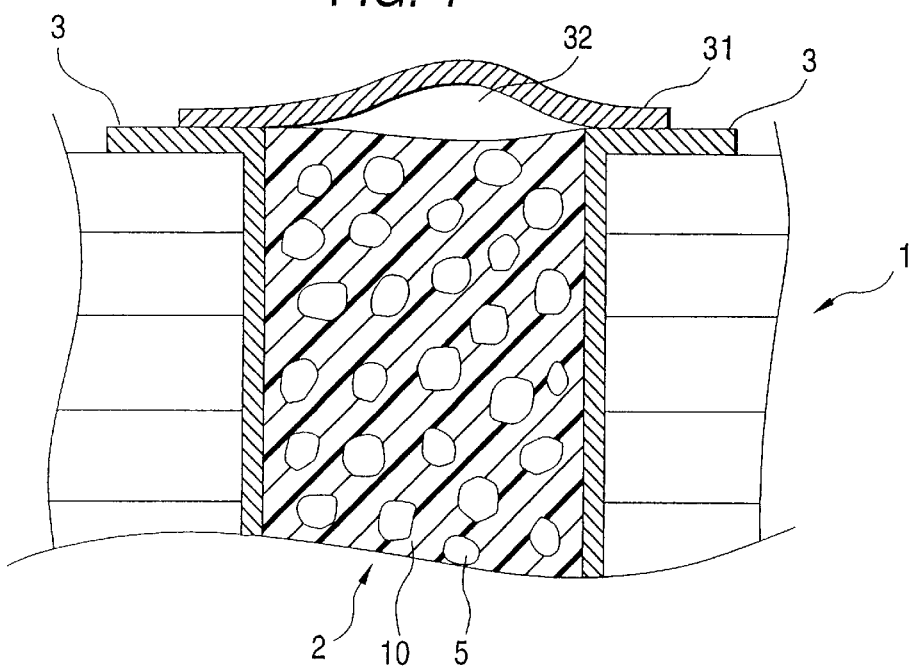
FIG. 4 is a schematic cross section of a PWB in which a built-up layer is formed on the PWB of FIG. 1, and a via-hole is made therein on the position corresponding to the through-hole.
Figure 5:
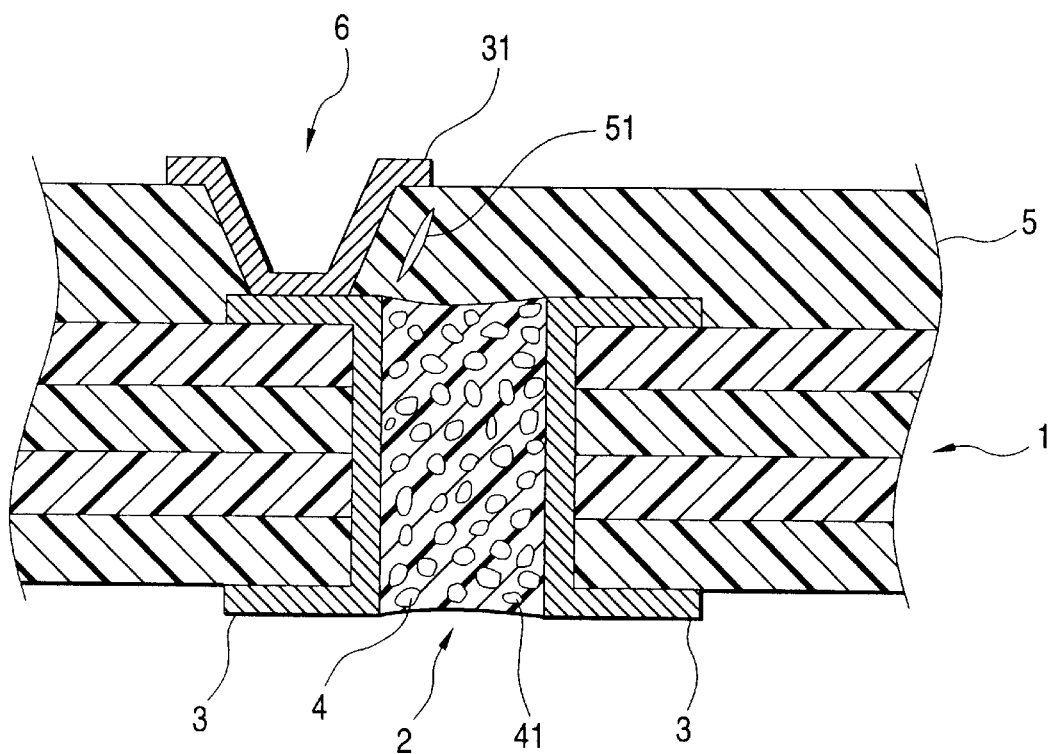
FIG. 5 is a schematic cross section of a PWB in which a crack developed in a built-up layer.

Accordingly, the 1st to 9th embodiments according to the first aspect of the present invention makes it feasible to laminate a built-up layer 6 after boring a through-hole 2 and to make a via-hole 7 right above the through-hole 2 as shown in FIG. 2.

After curing the paste of the present invention stuffed in through-holes, a copper deposit layer can be formed thereon as follows. An insulating resin is applied to both sides of a PWB inclusive of the openings of the through-holes filled with the first cured resin of the paste. The insulating resin layer is polished with a buff or a belt sander. The entire surface of both sides of the PWB is electrolessly plated with copper. A plating resist is applied to the copper deposit layer, exposed patternwise, and developed to make an opening on each through-hole. The openings are electroplated with copper, and the resist is stripped off. The residual electrolessly deposited copper layer is removed to leave a copper deposit layer on the through-holes.

The paste for through-hole filling according to a 10th embodiment of the present invention contains (A) 100 parts by weight of an epoxy resin composition including 90 to 99.5 parts by weight of an epoxy resin and 0.5 to 10 parts by weight of a curing agent, (B) 100 to 1000 parts by weight of a metallic filler, and (C) 10 to 900 parts by weight of an inorganic filler, the paste having a viscosity of not higher than 20,000 poise at 25° C. and a volatile content of not more than 1.0% when heated in a filling step, and the paste exhibiting such shrink-resistance properties that when a first cured resin obtained by heating in a filling step is re-heated and cooled in a solder reflow step to obtain a second cured resin, the shrinkage percentage of the first cured resin to the second cured resin in the longitudinal direction of the through-hole being not greater than 0.1%.

The shrinkage percentage as referred to in the 10th embodiment has the same meaning as in the 1st to 7th embodiments, being calculated from the equation (1).

The paste of the 10th embodiment has a viscosity of not higher than 20,000 poise, preferably 15,000 poise or lower, still preferably from 500 to 10,000 poise, measured at 25° C. If the viscosity exceeds 20,000 poise, the workability in filling through-holes with the paste is considerably reduced. The volatile content of the paste in a filling step is not more than 1.0%, preferably 0.2% or less. If the volatile content exceeds 1.0%, the copper deposit layer formed on through-holes undergoes separation and blistering in reliability tests, etc., and air bubbles tend to occur in the first cured resin. Further, the first cured resin may tend to come off the copper deposit layer formed on the inner wall of through-holes to produce gaps.

If the shrinkage percentage of the first cured resin due to re-heating and cooling in a solder reflow step exceeds 0.1%, cracking tends to occur in a built-up layer after the cooling or in reliability tests, etc.

In order to prevent separation and blistering of a copper deposit layer, gap formation in through-holes, and cracking in a built-up layer, the present invention teaches, in its second aspect, using a paste for through-hole filling which contains a resin that hardly shrinks on curing and contains a mixture of a metallic filler and an inorganic filler in a particularly high proportion. As the paste does not need a volatile solvent, there is generated little volatile matter on curing in the filling step, whereby formation of air bubbles in the first cured resin is suppressed.

The metallic filler used includes copper particles, silver particles, or a mixture thereof. The average particle size of the metallic filler is preferably 1 to 20 μm, which provides a 11th embodiment of the present invention. If the average particle size is smaller than 1 μm, the adhesion of the first cured resin to a copper deposit layer is lowered. If it is greater than 20 μm, separation between the first cured resin and a copper deposit layer also occurs, tending to cause the copper deposit layer to blister. If the amount of the metallic filler in the paste is less than 100 parts by weight, the adhesion between the first cured resin and a copper deposit layer is reduced, and the first cured resin will have an increased water absorption. The water absorption of the first cured resin is preferably 0.3% or less. With the water absorption being so small, the first cured resin will exhibit a strong adhesive strength to a copper deposit layer, and separation and blistering of a copper deposit layer will be prevented with more certainty. If the amount of the metallic filler is more than 1000 parts by weight, the paste has an increased viscosity to reduce the workability in filling through-holes.

A still preferred average particle size of the metallic filler is from 3 to 15 μm, particularly from 7 to 12 μm. A particularly preferred amount of the metallic filler is from 100 to 800 parts by weight. With the average particle size and the proportion of the metallic filler falling within these preferred ranges, the adhesive strength of the first cured resin to a copper deposit layer is further enhanced, and filling of through-holes with the paste is easy.

Of various metallic fillers copper particles are preferred for their excellent affinity to deposited copper. While copper particles as a filler can be spherical, flaky, dendritic, etc., the shape of the particles is not particularly limited as long as the resulting paste has a viscosity of 20,000 poise or less at 25° C. It is preferred, however, to use filler particles at least a half (weight) of which are spherical so as to control an increase of viscosity of the paste when the filler is added in a large quantity (14th embodiment).

It is still preferred to use soft-etched spherical copper particles or blackened spherical copper particles. Where copper particles are subjected to a blackening treatment, a prickly film of copper oxide is formed on the surface of the particles, and the particles having its surface thus roughened show an anchor effect and improved chemical affinity to the matrix resin to achieve enhanced adhesion to the resin. As a result, formation of air bubbles in the first cured resin can be prevented, and the adhesion of the cured resin to a copper deposit layer is improved.

The affinity of the metallic filler to the epoxy resin can also be improved by treating the filler particles with a silane coupling agent having an epoxy group. In particular, treatment with an epoxysilane having an epoxy group on the hydrophobic side thereof is also effective in reducing the water absorption of the first cured resin.

Any kind of inorganic fillers generally employed as a filler of epoxy resins can be used in the 10th embodiment without particular restriction. Examples of useful inorganic fillers are silica, mica, calcium carbonate, alumina, iron oxide, electrolytic iron powder, slate powder, and talc. Of these inorganic fillers preferred is silica having a small coefficient of thermal expansion. Further, spherical inorganic filler particles are preferred so that the inorganic filler may be incorporated in as large a proportion as possible while controlling an increase in viscosity of the paste. The affinity of the inorganic filler particles to the epoxy resin can be improved by treating the inorganic filler with a silane coupling agent. The treatment with a silane coupling agent is also effective in reducing the water absorption of the first cured resin.

The inorganic filler preferably has an average particle size of 0.1 to 10 μm, which provides a 12th embodiment of the present invention. If the average particle size of the inorganic filler is smaller than 0.1 μm, the paste has an increased viscosity to have reduced workability in filling through-holes. If it is greater than 10 μm, a copper deposit layer tends to peel off the first cured resin and blister. If the amount of the inorganic filler in the paste is less than 10 parts by weight, improvement in the workability in filling through-holes with the paste is not sufficient. If the amount of the inorganic filler is more than 900 parts by weight, the paste has an increased viscosity to reduce the workability in filling through-holes.

A still preferred average particle size of the inorganic filler is from 0.5 to 10 μm, particularly from 1 to 5 μm. A particularly preferred amount of the inorganic filler is from 10 to 500 parts by weight. With the average particle size and the proportion of the inorganic filler falling within these preferred ranges, the adhesive strength of the first cured resin to a copper deposit layer is further enhanced, and the workability of the paste in filling through-holes is sufficiently improved.

While not limiting, it is preferred that the particle size of the inorganic filler be smaller than that of the metallic filler. More specifically, the ratio of the average particle size of the inorganic filler $S_1$ to the average particle size of the metallic filler $S_2$, i.e., $S_1/S_2$, preferably ranges from 0.02 to 0.5, which provides a 13th embodiment of the present invention. The $S_1/S_2$ ratio is still preferably 0.02 to 0.2, and particularly preferably 0.05 to 0.1. To use an inorganic filler whose particle size is far smaller than that of the metallic filler permits us to incorporate a filler into a resin matrix in a proportion as large as possible while controlling an increase in viscosity of the resulting paste.

The epoxy resin composition used in the 10th embodiment contains 90 to 99.5 parts by weight of an epoxy resin and 0.5 to 10 parts by weight of a curing agent therefor. While acid anhydrides or catalyst type curing agents can be used widely as a curing agent for an epoxy resin, catalyst type curing agents, for example, imidazole curing agents are particularly preferred in order to decrease the viscosity of the paste and the water absorption of the first cured resin. A preferred proportion of the curing agent is from 2 to 7 parts by weight, particularly about 5 parts by weight.

In a 15th embodiment, the epoxy resin in the epoxy resin composition contains (1) a phenol novolak epoxy resin and (2) at least one of a bisphenol A epoxy resin and a bisphenol F epoxy resin, the proportion of the phenol novolak epoxy resin (1) being not less than 70 parts by weight per 100 parts by weight of the total amount of (1) and (2). The phenol novolak epoxy resin is suited to use in a paste for filling through-holes because of its smaller shrinkage on curing and its relatively high Tg. However, a paste containing the phenol novolak epoxy resin and a filler becomes hard and brittle when cured secondarily in a solder reflow step and tends to suffer cracks through thermal history in, e.g., a cycling test given later. Therefore, it is advised in the 15th embodiment that the phenol novolak epoxy resin be blended with other epoxy resins having excellent flexibility whereby the hardness of the second cured resin is controlled to suppress crack development in the second cured resin.

The epoxy resins with excellent flexibility is selected from a bisphenol A epoxy resin and a bisphenol F epoxy resin. These bisphenol type epoxy resins generally shrink more and have a lower Tg than the phenol novolak epoxy resin but exhibit more flexibility, mostly have a relatively low viscosity at room temperature, and also have a low water absorption. Therefore, blending of the bisphenol type epoxy resin into the phenol novolak epoxy resin provides a paste that is excellent in workability in a filling step and, after secondary curing in a solder reflow step, keeps moderate hardness. Sufficient heat resistance of the epoxy resin is assured if its Tg is 125° C. or above, preferably 130° C. or above, still preferably 140° C. or above.

The phenol novolak epoxy resin (1) is used in an amount of at least 70 parts by weight, particularly of from 70 to 99 parts by weight, per 100 parts by weight of the total epoxy resins. If the amount of the phenol novolak epoxy resin (1) is less than 70 parts by weight, that is, if the amount of the bisphenol epoxy resin (2) added to the phenol novolak epoxy resin (1) exceeds 30 parts by weight, the first cured resin tends to shrink largely in a solder reflow step to develop cracks in a built-up layer. Additionally the heat resistance of the blended epoxy resin tends to decrease. On the other hand, if the amount of the phenol novolak epoxy resin (1) is more than 99 parts by weight, that is, if the amount of the bisphenol epoxy resin (2) is less than 1 part by weight, the effect of the resin (2) may be insufficient, and it is likely that the second cured resin may become too hard to avoid cracking. Further, the resulting paste has a high viscosity, and it is not easy to fill through-holes with it. A preferred range of the amount of the phenol novolak epoxy resin (1) is from 80 to 97 parts, particularly 85 to 95 parts, by weight per 100 parts by weight of the total epoxy resins. Within this preferred range, the resulting paste is easy to stuff into through-holes and shows only a slight shrinkage in a solder reflow step.

In a 16th embodiment of the present invention, the heating temperature in a filling step preferably ranges from 120 to 170° C., and that in a solder reflow step preferably ranges from 230 to 280° C. In the filling step, the epoxy resin does not cure sufficiently at a heating temperature lower than 120° C. At temperatures above 170° C., although cracking in a built-up layer in a solder reflow step can be inhibited, the second cured resin itself tends to develop cracks in the subsequent cycling test, etc. If the heating temperature in a solder reflow step is below 230° C., it is impossible to mount IC chips, etc. on the resulting PWB. If it exceeds 280° C., the epoxy resin may tend to undergo thermal deterioration.

The paste for filling through-holes according to a 17th embodiment of the present invention contains (A) 100 parts by weight of an epoxy resin composition including 90 to 99.5 parts by weight of an epoxy resin and 0.5 to 10 parts by weight of a curing agent, (B) 100 to 1000 parts by weight of a metallic filler, and (C) 10 to 900 parts by weight of an inorganic filler, the paste having a viscosity of not higher than 20,000 poise at 25° C. and a volatile content of not more than 1.0% when heated in a filling step, and the paste exhibiting such shrink-resistance properties that when a 5-mm wide test piece which is prepared by making a 100 μm-thick film of the paste and curing the film by heating at 150° C. for 5 hours is heated at a starting temperature of 23° C. up to 270° C. and then cooled to 23° C. under a load of 5 g applied in the longitudinal direction of the test piece, the shrinkage percentage of the test piece in the longitudinal direction is not greater than 0.1%. The shrinkage percentage as referred to here is calculated according to the equation (2).

In the 17th embodiment, the shrink-resistance properties of the paste are not evaluated based on the shrinkage of the paste as stuffed into a through-hole and cured and again cured in a solder reflow step. However, it has been confirmed that a paste having a shrinkage percentage of 0.1% or less as determined by the manner as specified in the 17th embodiment does not cause peeling or blisters of a copper deposit layer, gap formation in a through-hole, or crack development in a built-up layer when it is actually stuffed into a through-hole and cured in a filling step and then re-heated, followed by cooling in a solder reflow step. That is, what is intended by the 17th embodiment resides in that one can easily distinguish a practically useful paste from practically useless ones by such a convenient screening method. The rate of temperature rise and drop in the measurement of a shrinkage percentage is preferably 1 to 5° C./min, still preferably 1 to 3° C./min, particularly preferably 2° C./min. It is preferable that the test piece be cooled immediately after the temperature reaches 270° C.

The present invention provides, in its 18th embodiment, a PWB having through-holes filled with a heat-curing product of a paste according to any one of the 10th to 17th embodiments. In the PWB of this embodiment, peeling and blistering of a copper deposit layer, gap formation in the through-holes, air bubble formation in the first cured resin, crack development in a built-up layer in a solder reflow step, and the like are prevented satisfactorily. Therefore, the PWB easily achieves high density wiring and can be made up of an increased number of wiring layers. That is, the PWB can be an ML-PWB with excellent performance.

Since the pastes of the 10th to 17th embodiments according to the second aspect of the present invention contain both a metallic filler and an inorganic filler, they have sufficient flowability and easily flow in and fill through-holes. While not necessarily clear, the improved flowability is considered to be because the presence of the inorganic filler diminishes the ratio of the contact of the metallic filler particles with each other, and the friction among filler particles as a whole is reduced as a result.

Where a phenol novolak epoxy resin made up of bulky and rigid molecules is used with a large quantity of fillers according to the 15th embodiment, the resin molecules show limited movement on curing due to the steric hindrance, only having a small shrinkage percentage of not more than 0.1% in a solder reflow step, and development of cracks in a built-up layer is inhibited sufficiently. The combined use of a proper amount of a bisphenol epoxy resin that is made up of linear and flexible molecules not only secures excellent workability of the paste in filling through-holes but also prevents the second cured resin from suffering cracks due to changes in temperature, etc. of the environment in which electronic equipment containing the resulting PWB is used.

The present invention also provides in its third aspect a paste for filling through-holes which contains (A) an epoxy resin composition containing an epoxy resin and a curing agent and (B) a filler, wherein the epoxy resin contains an amine type epoxy resin, which corresponds to a 19th embodiment of the present invention.

Use of the amine type epoxy resin sufficiently suppresses crack development in a built-up layer. Besides being effective in suppressing cracking, the amine type epoxy resin has a low viscosity. Therefore, the resulting paste has of necessity a reduced viscosity to secure greatly improved workability in filling through-holes. The low viscosity of the amine type epoxy resin also permits incorporation of a large proportion of a filler, which further ensures prevention of crack development in a built-up layer.

The amine type epoxy resin which can be used in the present invention include tetrafunctional epoxy resins, such as tetraglycidylaminodiphenylmethane and tetraglycidyl-m-xylenediamine; trifunctional epoxy resins, such as triglycidyl-m-aminophenol and triglycidyl-p-aminophenol; and bifunctional epoxy resins, such as diglycidylaniline and diglycidyl-o-toluidine.

Although an amine type epoxy resin with lesser functionality has a lower viscosity, one having higher functionality is preferred for controlling shrinkage of the first cured resin in a solder reflow step. However, tetrafunctional epoxy resins becomes a rigid cured resin, and the rigid cured resin itself is liable to develop cracks. Taking the balance between viscosity and rigidity into consideration, it is preferred, as a 20th embodiment of the present invention, to use a trifunctional amine type epoxy resin which is liquid at ambient temperature, i.e., at a temperature of about 20 to 30° C., particularly about 23 to 25° C., and has a low viscosity. A paste containing such a trifunctional amine type epoxy resin provides a curing product having a high Tg. Of the trifunctional amino type epoxy resins, triglycidyl-p-aminophenol having a lower viscosity is still preferred, which provides a 21st embodiment of the present invention. A paste containing triglycidyl-p-aminophenol exhibits excellent workability in filling through-holes without causing resin starvation and sufficiently inhibits crack development in a built-up layer.

Because the amine type epoxy resin has a high water absorption, the first cured resin obtained in a filling step sometimes has a high water absorption. Therefore it is preferably used in combination with other epoxy resins having a low water absorption, such as polyphenol type epoxy resins. It is particularly preferred to use the amine type epoxy resin in combination with at least one of a phenol novolak epoxy resin and a bisphenol A epoxy resin, which provides a 22nd embodiment of the present invention. According to this embodiment, shrinkage of the first cured resin in a solder reflow step can further be reduced. Considered that a paste containing a phenol novolak epoxy resin alone as an epoxy resin component will have a considerably high viscosity, a combined use of the amine type epoxy resin and the phenol novolak epoxy resin provides a practical paste with a lowered viscosity.

The amine type epoxy resin is preferably used in an amount of 10 to 50 parts by weight, particularly 15 to 45 parts by weight, especially 20 to 40 parts by weight, per 100 parts by weight of the total epoxy resins. If the amount of the amine type epoxy resin is less than 10 parts by weight, the viscosity of the resulting paste is not lowered enough to exhibit excellent workability in a filling step, tending to cause resin starvation. If the amount exceeds 50 parts by weight, the first cured resin will have a high water absorption, and cracks tend to develop in the second cured resin or in the surroundings when subjected to reliability tests.

It is preferred for the above-described paste to have a viscosity of not higher than 10,000 poise at 25° C. and to have such shrink-resistance properties that when a first cured resin obtained by heating in a filling step is re-heated and cooled in a solder reflow step to obtain a second cured resin, the shrinkage percentage of the first cured resin to the second cured resin in the longitudinal direction of the through-hole is not greater than 0.1%, which provides a 23rd embodiment of the present invention.

A still preferred viscosity of the paste according to the 23rd embodiment is 7,000 poise or lower, particularly 5,000 poise or lower, at 25° C. If the viscosity exceeds 10,000 poise, the paste has reduced workability in a filling step, tending to cause resin starvation.

If the shrinkage percentage of the first cured resin due to re-heating and cooling in a solder reflow step exceeds 0.1%, cracking tends to occur in a built-up layer after the cooling or in reliability tests, etc. The shrinkage percentage can be obtained from the readings of the TMA curve. As the paste does not need a volatile solvent, there is generated little volatile matter on curing in the filling step, whereby formation of air bubbles in the first cured resin is suppressed.

The shrinkage percentage as referred to above can be measured using a test piece of the cured resin film in the same manner as in the 8th and 17th embodiments of the present invention and calculated according to the equation (2). This method of measurement is not for evaluating the shrink-resistance properties of the paste as stuffed into a through-hole and cured in a filling step and again cured in a solder reflow step. However, it has been confirmed that a paste having a shrinkage percentage of 0.1% or less as measured by this method sufficiently inhibits crack development in a built-up layer when it is actually stuffed into a through-hole and cured in a filling step and then re-heated, followed by cooling in a solder reflow step. That is, one can easily distinguish a practically useful paste from practically useless ones by such a convenient screening method. The rate of temperature rise and drop in the measurement of a shrinkage percentage is preferably 1 to 5° C./min, still preferably 1 to 3° C./min, particularly preferably 2° C./min. It is preferable that the test piece be cooled immediately after the temperature reaches 270° C.

High-temperature curing type curing agents are used in the 19th to 23rd embodiments. Taking the rheological characteristics of the paste or reduction in viscosity into consideration, catalyst type curing agents are preferred. Particularly preferred are imidazole curing agents, which produce pastes having a pot life long enough for practical use (24th embodiment). Acid anhydrides, boron trifluoride, etc. are also known as a high-temperature curing type curing agents, but they are not favorable because they have high reactivity with an amine type epoxy resin to reduce the pot life of the resulting paste. The imidazole curing agent is preferably used in an amount of 0.5 to 10 parts by weight, particularly 1 to 8 parts by weight, especially 3 to 7 parts by weight, per 100 parts by weight of the epoxy resin composition.

The heating temperature in a filling step using the paste of the 19th embodiment preferably ranges from 120 to 170° C., and that in a solder reflow step preferably ranges from 230 to 280° C. In the filling step, the epoxy resin does not cure sufficiently at a heating temperature lower than 120° C. At temperatures above 170° C., although cracking in a built-up layer in a solder reflow step can be inhibited, the second cured resin itself tends to develop cracks in the subsequent cycling test, etc. If the heating temperature in a solder reflow step is below 230° C., it is impossible to mount IC chips, etc. on the resulting PWB. If it exceeds 280° C., the epoxy resin may tend to undergo thermal deterioration.

In order to suppress shrinkage of the first cured resin in a solder reflow step, the paste contains a filler. The filler to be incorporated may be an inorganic filler, a metallic filler, or a combination thereof (25th embodiment). While an inorganic filler is preferred for suppression of shrinkage of a cured resin, the purpose could be achieved sufficiently with a metallic filler.

Any kind of inorganic fillers generally employed as a filler of epoxy resins can be used in the present invention without particular restriction. Examples of useful inorganic fillers are silica, mica, calcium carbonate, alumina, iron oxide, electrolytic iron powder, slate powder, and talc. Of these inorganic fillers preferred is silica having a small coefficient of thermal expansion. Further, spherical inorganic filler particles, e.g., spherical silica particles, are preferred so that the inorganic filler may be incorporated in as large a proportion as possible while controlling an increase in viscosity of the paste. The affinity of the inorganic filler particles to the epoxy resin can be improved by treating the inorganic filler with a silane coupling agent. The treatment with a silane coupling agent is also effective in reducing the water absorption of the first cured resin.

Examples of useful metallic fillers are copper particles, silver particles, or a mixture thereof. It is preferred to use metallic filler particles at least a half (weight) of which are spherical so as to control an increase of viscosity of the paste when the metallic filler is added in a large quantity. It is still preferred to use soft-etched spherical copper particles or spherical copper particles having been subjected to a blackening treatment. Where copper particles are subjected to a blackening treatment, a prickly film of copper oxide is formed on the surface of the particles, and the particles having its surface thus roughened show an anchor effect and improved chemical affinity to the matrix resin to achieve enhanced adhesion to the resin. The affinity of the metallic filler to the epoxy resin can also be improved by treating the filler particles with a silane coupling agent having an epoxy group. In particular, treatment with an epoxysilane having an epoxy group on the hydrophobic side thereof is also effective in reducing the water absorption of the first cured resin.

In order to suppress shrinkage of the cured resin in a solder reflow step, it is preferable to use these fillers in large quantities, but consideration should be taken so as not to deteriorate the workability of the paste in filling through-holes due to an increased paste viscosity. For example, silica is preferably used in an amount of about 60 to 90 parts by weight per 100 parts by weight of the paste. As far as the silica content falling within this range, the resulting paste has a moderate viscosity and shows excellent workability in filling through-holes, causing no resin starvation. Crack development in a built-up layer is also suppressed sufficiently. Where a metallic filler and an inorganic filler are used in combination, the mixing ratio is not particularly limited. The total filler content and the proportion of the metallic filler are to be selected so that the flowability of the resulting paste may not be so reduced as to be problematical in practice.

The paste according to the 19th to 25th embodiments can have a viscosity of 1,000 to 5,000 poise, preferably 1,000 to 3,500 poise, at 25° C. and a water absorption of 0.5 to 1.05, preferably 0.5 to 0.8%. In addition to such low viscosity and water absorption, the paste can have a shrinkage percentage of 0.01 to 0.1%, preferably 0.01 to 0.08%, still preferably 0.01 to 0.05%. In a particularly preferred mode, the paste can have a viscosity of 1,000 to 3,000 poise at 25° C., a water absorption of 0.1 to 0.2%, and a shrinkage percentage lower than 0.01%. Methods of measurement of the viscosity, water absorption and shrinkage percentage are described in Examples hereinafter given.

It is appear that the shrink-resistance properties of the paste containing the amine type epoxy resin in a solder reflow step might be accounted for as follows. Unlike general-purpose epoxy resins, such as bisphenol A epoxy resins and bisphenol F epoxy resins, which are composed of linear and flexible molecules, the amine type epoxy resins, such as triglycidyl-p-aminophenol, are made up of bulky molecules. It appears, therefore, that the molecules of the amine type epoxy resin show limited movement on curing due to the steric hindrance, only having a small shrinkage percentage of not more than 0.1% in a solder reflow step, and development of cracks in a built-up layer is thereby inhibited sufficiently.

The inventors have found that the cause of cracks developed in a built-up layer does not reside in a difference of thermal expansion between a PWB and a paste stuffed into through-holes as is commonly accepted but in the fact that the once heat-cured paste obtained in a filling step undergoes further curing on re-heating at about 270° C. in a solder reflow step and undergoes further shrinkage on cooling after the re-heating. That is, the first cured resin shrinks on the secondary curing in the longitudinal direction of the through-holes, which generates a tensile stress in a built-up layer to develop cracks therein.

The present invention provides, in its fourth aspect (26th embodiment), a paste for filling through-holes which exhibits such shrink-resistance properties that when a first curing product obtained by heating in a filling step is re-heated and cooled in a solder reflow step to obtain a second curing product, the shrinkage percentage of the curing product in the longitudinal direction of the through-hole is not greater than 0.1%, the shrinkage percentage of the curing product being represented by the equation (1).

If the shrinkage percentage of the curing product of the paste in a solder reflow step exceeds 0.1%, cracking in a built-up layer cannot be suppressed sufficiently. In order to suppress the shrinkage of the curing product, it is effective to use a paste containing a resin having a small shrinkage on heating and cooling in a solder reflow step and a large proportion of an inorganic filler.

Any kind of resins can be used as long as it has a small shrinkage percentage on heating and cooling in a solder reflow step. Such resins include thermosetting resins, such as epoxy resins, phenol resins, unsaturated polyester resins, diallyl phthalate resins, polyimide resins, urethane resins, melamine resins, and urea resins. Thermoplastic resins that are melted at a temperature adopted in a filling step to acquire flowability enough to be stuffed into through-holes, such as acrylic resins and methacrylic resins, are also employable. Of these resins, epoxy resins which shrink less than other resins on curing are particularly useful for the purpose.

Accordingly, the above-described paste for filling through-holes preferably contains (A) an epoxy resin composition and (B) an inorganic filler, which provides a 27th embodiment of the present invention. In using the epoxy resin composition, the heating temperature in a filling step is preferably 120 to 170° C. and that in a solder reflow step is preferably 230 to 280° C. In the filling step, the epoxy resin does not cure sufficiently at a heating temperature lower than 120° C. At temperatures above 170° C., although cracking in a built-up layer in a solder reflow step can be inhibited, the second cured resin itself tends to develop cracks in the subsequent thermal history in, e.g., a cycling test. If the heating temperature in a solder reflow step is below 230° C., it is not easy to mount IC chips, etc. on the resulting PWB. If it exceeds 280° C., the epoxy resin may tend to undergo thermal deterioration. The epoxy resin composition as referred to in the 27th embodiment contains at least 90% by weight of an epoxy resin and a curing agent therefor. If desired, it may contains fillers and various additives other than an inorganic filler.

In a 28th embodiment, the above-described paste contains (A) 10 to 40 parts by weight of an epoxy resin composition and (B) 60 to 90 parts by weight of an inorganic filler, the epoxy resin composition containing (1) 70 to 99 parts by weight of at least one of a phenol novolak epoxy resin and a cresol novolak epoxy resin and (2) 1 to 30 parts by weight of at least one of a bisphenol A epoxy resin and a bisphenol F epoxy resin per 100 parts by weight of the total amount of (1) and (2).

The phenol novolak epoxy resin and cresol novolak epoxy resin are suited to use in a paste for filling through-holes because of their smaller shrinkage on secondary curing in a solder reflow step and their relatively high Tg. However, a paste containing these novolak epoxy resins and an inorganic filler becomes hard and brittle when cured secondarily in a solder reflow step and tends to suffer cracks. Therefore, it is advised in the 28th embodiment that these novolak epoxy resins be blended with other epoxy resins having excellent flexibility whereby the hardness of the second cured resin is controlled to suppress crack development in the second cured resin.

The epoxy resins with excellent flexibility is selected from a bisphenol A epoxy resin and a bisphenol F epoxy resin. These bisphenol type epoxy resins generally shrink more and have a lower Tg than the novolak epoxy resins but exhibit more flexibility, mostly have a relatively low viscosity at room temperature, and also have a low water absorption. Therefore, blending of the bisphenol type epoxy resin into the novolak epoxy resin provides a paste that is excellent in workability in a filling step and, after secondary curing in a solder reflow step, keeps moderate hardness. The epoxy resin preferably has a Tg of 125° C. or above, still preferably 130° C. or above, particularly preferably 140° C. or above. The paste preferably has a viscosity of not higher than 50,000 poise, particularly 100 to 20,000 poise, especially 500 to 10,000 poise, at 25° C. With the Tg of the epoxy resin and the viscosity of the paste falling within these preferred ranges, the paste exhibits sufficient heat resistance and excellent workability in filling through-holes.

If the amount of the bisphenol epoxy resin (2) is less than 1 part by weight based on the total epoxy resin, it is likely that the second cured resin may become too hard to avoid cracking. Further, the resulting paste has a high viscosity, and it is not easy to fill through-holes with it. If the amount of the bisphenol epoxy resin (2) exceeds 30 parts by weight, the first cured resin tends to shrink largely in a solder reflow step, failing to sufficiently suppress crack development in a built-up layer. Additionally the heat resistance of the blended epoxy resin tends to decrease. The proportion of the bisphenol epoxy resin (2) in the total epoxy resin still preferably ranges from 5 to 25 parts by weight, particularly 10 to 20 parts by weight. Within these ranges, there is obtained a paste which is easy to stuff into through-holes, keeps moderate hardness after curing, and shows only a slight shrinkage in a solder reflow step.

Any kind of inorganic fillers generally employed as a filler of epoxy resins can be used without particular restriction in the 27th embodiment. Examples of useful inorganic fillers are silica, mica, calcium carbonate, alumina, iron oxide, electrolytic iron powder, slate powder, and talc. Of these inorganic fillers preferred is silica having a small coefficient of thermal expansion. In order to incorporate the inorganic filler in as large a proportion as possible while controlling an increase in viscosity of the paste, spherical inorganic filler particles, e.g., spherical silica particles, are particularly preferred. Further, inorganic filler particles having a broad size distribution with 2 to 3 peaks are preferred to mono-dispersed particles.

If the proportion of the inorganic filler in the paste is less than 60 parts by weight, i.e., if the proportion of the epoxy resin composition exceeds 40 parts by weight, shrinkage of the first cured resin in a solder reflow step is not suppressed sufficiently. If the proportion of the inorganic filler is more than 90 parts by weight, i.e., if the proportion of the epoxy resin composition is less than 10 parts by weight, the viscosity of the paste greatly increases, exceeding 50,000 poise at 25° C., to have reduced workability in filling through-holes. A preferred paste contains (A) 10 to 30 parts by weight of the epoxy resin composition and (B) 70 to 90 parts by weight of the inorganic filler, which provides a 29th embodiment of the present invention. With such an high inorganic filler content, the shrinkage of the first cured resin in a solder reflow step can be made slighter.

The present invention provides, as a 30th embodiment, a paste for filling through-holes which exhibits such shrink-resistance properties that when a 5-mm wide test piece which is prepared by making a 100 μm-thick film of the paste and curing the film by heating at 150° C. for 5 hours is heated at a starting temperature of 23° C. up to 270° C. and then cooled to 23° C. under a load of 5 g applied in the longitudinal direction of the test piece, the shrinkage percentage of the test piece in the longitudinal direction is not greater than 0.1%. The shrinkage percentage as referred to here is calculated according to the equation (2).

In the 30th embodiment, the shrink-resistance properties of the paste are not evaluated based on the shrinkage of the paste as stuffed into a through-hole and cured and again cured in a solder reflow step. However, it has been confirmed that a paste having a shrinkage percentage of 0.1% or less as determined by the manner as specified above suppresses crack development in a built-up layer sufficiently when it is actually stuffed into a through-hole and cured in a filling step and then re-heated, followed by cooling in a solder reflow step. That is, one can easily distinguish a practically useful paste from practically useless ones by such a convenient screening method. The rate of temperature rise and drop in the measurement of a shrinkage percentage is preferably 1 to 5° C./min, still preferably 1 to 3° C./min, particularly preferably 2° C./min. It is preferable that the test piece be cooled immediately after the temperature reaches 270° C.

The present invention provides, in its 31st embodiment, a PWB having through-holes filled with a heat-curing product of a paste according to any one of the 26th to 30th embodiments. In the PWB of this embodiment, crack development in a built-up layer is prevented satisfactorily. Therefore, the PWB easily achieves high density wiring and can be made up of an increased number of wiring layers. That is, the PWB can be an ML-PWB with excellent performance.

A conventional paste for filling through-holes, even after once cured in a filling step, suffers considerable thermal expansion when exposed to a temperature above the Tg of the matrix resin in a solder reflow step for mounting, for example, about 270° C. It has been believed that crack development in a built-up layer is due to the difference in degree of thermal expansion of the first cured resin and that of the wiring substrate in the solder reflow step. In fact, however, the first cured resin undergoes secondary curing in the solder reflow step, resulting in a shrinkage of the cured resin. The shrinkage of the cured resin in the longitudinal direction of the through-holes is considered to produce a tensile stress in a built-up layer, which is the cause leading to crack development. Accordingly, use of the paste according to the 26th to 30th embodiments, which shows a small shrinkage in a solder reflow step, will suppress crack development irrespective of its coefficient of thermal expansion.

Since the paste of the 26th to 30th embodiments, especially the 28th and 29th embodiments, contains the inorganic filler in a high proportion and the novolak epoxy resin composed of bulky and rigid molecules, the molecular movement of the matrix resin during curing is limited due to the steric hindrance. As a result, the shrinkage percentage of the first cured resin in a solder reflow step is as small as 0.1% or less, and development of cracks in a built-up layer is thereby inhibited. Where an adequate amount of the bisphenol epoxy resin made up of linear and flexible molecules is used in combination, the paste exhibits excellent workability in a filling step, and the second cured resin itself suffers from no cracks even when exposed to temperature changes, etc. on use.

If desired, the paste according to the present invention hereinabove described can contain appropriate amounts of various additives as far as the characteristics of the paste are not impaired. Useful additives include antifoaming agents, leveling agents, and antioxidants.

The present invention will now be illustrated in greater detail with reference to Examples, but it should be understood that the present invention are not construed as being limited thereto. Unless otherwise noted, all the parts are given by weight.

EXAMPLES 1 TO 7 AND COMPARATIVE EXAMPLES 1 TO 5

(1) Preparation of Paste and Measurement of Viscosity:

A paste for filling through-holes was prepared by mixing the filler and the epoxy resins shown in Table 1 at a mixing ratio shown and adding thereto 5 parts of an imidazole curing agent for the epoxy resins (2E4MZ-CN, produced by Shikoku Chemicals Corp.). The viscosity of the resulting paste at 25° C. was measured with a rotating spindle viscometer. In Table 1 "PN" stands for a phenol novolak epoxy resin, "BPA" a bisphenol A epoxy resin, and "BPF" a bisphenol F epoxy resin. Taking the total amount of the epoxy resins as 100 parts, the proportion of the bisphenol epoxy resin was about 8.4 parts in Examples 1 to 3 and Comparative Examples 1 to 5 and about 26.3 parts in Examples 4 to 7. The spherical copper particles used in Examples 5 to 7 had been subjected to soft etching, a blackening treatment or a treatment with a silane coupling agent in a conventional manner.

The fillers, epoxy resins, etc. used were as follows.

(a) Filler
(1) Spherical copper powder having an average particle size of 5 μm (SF-R-Cu-5 μm, produced by Nippon Atomized Metal Powders Corporation)
(2) Spherical copper powder having an average particle size of 10 μm (CU-FN-10, produced by Fukuda Metal Foil & Powder Co., Ltd.)
(3) Dendritic copper powder having an average particle size of 6 μm (Den 4, produced by Japan Energy Corporation)
(4) Spherical copper powder having an average particle size of 25 μm (C0610, produced by Mitsui Mining and Smelting Co., Ltd.)
(5) Spherical silica powder having an average particle size of 1 μm (SO-E3, produced by Tatsumori Ltd.).

(b) Epoxy resin
(1) Phenol novolak epoxy resin (E-152, produced by Yuka Shell Epoxy K.K.)
(2) Bisphenol A epoxy resin (E-819, produced by Yuka Shell Epoxy K.K.)
(3) Bisphenol F epoxy resin (E-806, produced by Yuka Shell Epoxy K.K.)

(c) Surface treating agent
Epoxy-containing silane coupling agent (KBM403, produced by Shin-Etsu Chemical Co., Ltd.)

TABLE 1

| | | Metallic Filler | | | | |
|---|---|---|---|---|---|---|
| | | Kind | Average Particle Size (μm) | Surface Treatment | Amount (part) | Kind and Amount of Epoxy Resin |
| Example | 1 | spherical copper powder | 5 | none | 500 | PN(87) + BPA(8) |
| | 2 | spherical copper powder | " | " | 750 | " |
| | 3 | spherical copper powder | 10 | " | 500 | " |
| | 4 | spherical copper powder | " | " | " | PN(70) + BPF(25) |
| | 5 | spherical copper powder | " | soft etching | " | " |

TABLE 1-continued

| | | Kind | Average Particle Size ($\mu$m) | Surface Treatment | Amount (part) | Kind and Amount of Epoxy Resin |
|---|---|---|---|---|---|---|
| | 6 | spherical copper powder | " | soft etching + blackening | " | " |
| | 7 | spherical copper powder | " | soft etching + blackening + coupling agent | " | " |
| Comparative Example | 1 | spherical silica powder | 1 | none | 150 | PN(87) + BPA(8) |
| | 2 | spherical copper powder | 5 | " | 300 | " |
| | 3 | spherical copper powder | " | " | 1100 | " |
| | 4 | dendritic copper powder | 6 | " | 500 | " |
| | 5 | spherical copper powder | 25 | " | " | " |

(2) Measurement of volatile content of paste, water absorption of cured resin obtained by heating corresponding to a filling step, and peel strength of copper deposit layer on the cured resin:

The volatile content of the paste was measured with a DTA-TG apparatus at temperatures elevated up to 300° C. The paste was heated at 150° C. for 5 hours, and the water absorption of the resulting cured resin was measured in accordance with JIS K 6911. The paste was applied to a core board (copper-clad laminate; 100×100 mm) which had been subjected to a blackening treatment to a coating thickness of about 300 $\mu$m and heated at 150° C. for 5 hours to cure. The surface of the cured resin film was polished with a ceramic buff to conduct soft etching, and the cured resin film was plated with copper by electroless plating and electroplating to form a copper deposit layer having a thickness of about 100 $\mu$m. The peel strength of the copper deposit layer thus formed was measured in accordance with JIS C 6481.

(3) Measurement of Shrinkage Percentage on Heating and Cooling Corresponding to Solder Reflow Step:

The paste was cast on a synthetic resin sheet to form a 100 $\mu$m-thick film and heated at 150° C. for 5 hours to cure. A test piece 20 mm in length and 5 mm in width was cut out of the cured resin film. The test piece was set in a thermomechanical analyzer (TMA) with a load of 5 g applied in the longitudinal direction at a chuck distance of 15 mm, and temperature was raised from 23° C. to 270° C. at a rate of 2° C./min and then dropped to 23° C. at the same rate. The length of shrinkage, i.e., $\Delta l$ [the length of the test piece at 23° C. before temperature rise (l)—the length of the test piece at 23° C. after temperature drop; unit: $\mu$m] was read out from the resulting TMA curve, and the shrinkage percentage was calculated from $\Delta l/l \times 100$.

The results of these measurements are shown in Table 2 below.

TABLE 2

| | | Viscosity (poise) | Volatile Content (%) | Water Absorption (%) | Peel Strength (kgf/cm$^2$) | Shrinkage Percentage (%) |
|---|---|---|---|---|---|---|
| Example | 1 | 5000 | <0.20 | 0.28 | 0.86 | <0.1 |
| | 2 | 16000 | " | 0.17 | 0.95 | " |
| | 3 | 3500 | " | 0.22 | 0.93 | " |
| | 4 | 3700 | " | 0.22 | 0.93 | " |
| | 5 | 3500 | " | 0.24 | 1.05 | " |
| | 6 | 3700 | " | 0.25 | 1.24 | " |
| | 7 | 3800 | " | 0.20 | 1.06 | " |
| Comparative Example | 1 | 3600 | " | 0.71 | 0.23 (blisters) | 0.1 |
| | 2 | 2000 | " | 0.37 | 0.81 | 0.3 |
| | 3 | lumpy | — | — | — | — |
| | 4 | " | — | — | — | — |
| | 5 | 3200 | <0.20 | — | 0.88 (blisters) | — |

It is seen from Table 2 that in Examples 1 to 7 the viscosity of the paste ranges from 3,500 to 16,000 poise, the volatile content of the cured resin is less than 0.20%, the water absorption of the cured resin ranges from 0.17 to 0.28%, and the peel strength of the copper deposit layer from the cured resin ranges from 0.86 to 1.24 kgf/cm$^2$, proving the paste according to the present invention to have excellent characteristics. Seeing that the shrinkage percentage is less than 0.1% in every case when the cured product is heated to 270° C. and then cooled, it is expected that development of cracks in a built-up layer will be prevented with certainty. Further, in Examples 5 to 7 wherein surface-treated copper powder is used, the peel strength of the copper deposit layer formed on the cured resin film is so high as to exceed 1 kgf/cm$^2$. In particular in Example 6 wherein soft etching and a blackening treatment are combined, the peel strength reaches 1.24 kgf/cm$^2$.

On the other hand, in Comparative Example 1 wherein 150 parts of spherical silica is used, the volatile content and the water absorption are both high, and the copper deposit layer partly suffers from blisters and has a greatly reduced peeling strength. In Comparative example 2, in which the amount of the spherical copper powder is below the specified lower limit, although the peel strength is satisfactory, the water absorption is high, and the shrinkage percentage is far above the specified upper limit. In Comparative Examples 3 wherein the amount of the spherical copper powder exceeds the specified upper limit and Comparative Example 4 wherein dendritic (i.e., non-spherical) copper particles are used, the paste became lumpy, and evaluation of the characteristics could not be made. In Comparative Example 5 wherein the average particle size of the spherical copper particles used exceeds the upper limit, the copper deposit layer, while satisfactory in peel strength, partly suffered blisters, proving the paste impractical.

According to the present invention, the paste provides a first cured resin which exhibits excellent adhesion to a copper deposit layer formed thereon, causing neither peeling nor blistering of the copper deposit layer. No gaps are formed between the first cured resin and the copper deposit layer formed on the inner wall of through-holes. Further, the shrinkage percentage of the first cured resin in a solder reflow step in the longitudinal direction of through-holes is small, and development of cracks in a built-up layer can be suppressed. According to the present invention in which the use of the specific epoxy resin composition is defined, the shrinkage percentage is small, excellent workability in a filling step is secured, and the second cured resin itself is prevented from cracking even when a piece of equipment containing a PWB prepared by using the paste is exposed to environmental changes. The 8th embodiment offers a convenient means for confirming the excellent performance of the paste according to the 1st embodiment.

(3) Aerosil having an average particle size of 0.05 μm (AEROSIL 50, produced by Nippon Aerosil Co., Ltd.)

2) Workability in Filling Through-holes and Adhesion of Cured Resin to Copper Deposit Layer:

Through-holes were filled with the paste prepared above by screen printing, and the state of the paste filling the through-holes was observed with the naked eye. The paste in the through-holes was cured by heating at 150° C. for 5 hours, and the surface of the cured resin was polished with a ceramic buff to conduct soft etching. The cured resin was then plated with copper by electroless plating and electroplating to form a copper deposit layer having a thickness of about 100 μm. The adhesion of the formed copper deposit layer to the cured resin was evaluated by observation with the naked eye and by touching with a finger. The results of the evaluation are shown in Table 3.

TABLE 3

|  |  | Metallic Filler Content (part) | Inorganic Filler | | | State of Paste in Through-holes | Adhesion |
|---|---|---|---|---|---|---|---|
|  |  |  | Kind | Avg. Particle Size (μm) | Content (part) |  |  |
| Example | 8 | 750 | (1) | 1 | 20 | good | good |
|  | 9 | " | " | " | 40 | " | " |
|  | 10 | " | " | " | 80 | " | " |
|  | 11 | 100 | " | " | 200 | " | " |
| Comparative | 6 | 750 | " | " | 5 | air bubbles observed | — |
| Example | 7 | 50 | " | " | 200 | good | blisters observed |
|  | 8 | 750 | (2) | 12 | 40 | " | blisters observed |
|  | 9 | " | (3) | 0.05 | " | air bubbles observed | — |

In the PWB according to the 9th embodiment, separation between the first cured resin and the copper deposit layer formed in and on the through-holes does not occur, and cracking in a built-up layer and the second cured resin can be prevented. Therefore, it is easy to increase the wiring density and to increase the number of wiring layers.

EXAMPLES 8 TO 11 AND COMPARATIVE EXAMPLES 6 TO 9

1) Preparation of Paste:

A hundred parts of an epoxy resin composition consisting of 87 parts of a phenol novolak epoxy resin (E-152), 8 parts of a bisphenol A epoxy resin (E-819), and 5 parts of an imidazole curing agent (2E4MZ-CN) was mixed with the following metallic filler and inorganic filler in respective amounts shown in Table 3 below to prepare a paste for filling through-holes.

(a) Metallic filler
Spherical copper powder having an average particle size of 10 μm (CU-FN-10)
(b) Inorganic filler
(1) Spherical silica powder having an average particle size of 1 μm (SO-E3)
(2) Spherical silica powder having an average particle size of 12 μm (FB35X, produced by Denki Kagaku Kogyo Co., Ltd.)

As can be seen from Table 3, Examples 8 to 11, which are in accordance with the 10th embodiment of the present invention, showed satisfactory results in terms of the state of the paste stuffed into through-holes and adhesion of the cured product to a copper deposit layer. In Comparative Example 6 wherein the inorganic filler content is below the lower limit specified in the 10th embodiment, air bubbles were formed in the paste stuffed into the through-holes. In Comparative Example 7 in which the metallic filler content is below the lower limit specified in the 10th embodiment, the copper deposit layer partly underwent blistering due to poor adhesion. In Comparative Example 8 wherein the average particle size of the inorganic filler exceeds the upper limit specified in the 12th embodiment, the copper deposit layer partly underwent blistering. The paste of Comparative Example 9 in which the average particle size of the inorganic filler is below the lower limit specified in the 12th embodiment generated air bubbles in filling through-holes due to poor flowability.

3) Correlation Between Particle Size Ratio of Inorganic Filler and Metallic Filler and Viscosity of Paste:

In order to examine the effectiveness of the 13th embodiment of the present invention, a paste was prepared by mixing 100 parts of the same epoxy resin composition used in Examples 8 to 11 with 380 parts of spherical copper powder CU-FN-10 (average particle size: 10 μm) as a metallic filler and 30 parts of each of the following spherical silica species different in average particle size (all produced by Tatsumori K.K.) as an inorganic filler.
(1) SO-E5; average particle size: 2 μm
(2) SO-E3; average particle size: 1 μm
(3) SO-E2; average particle size: 0.5 μm
(4) SO-E1; average particle size: 0.2 μm The average particle size of the inorganic filler and that of the metallic filler being taken as $S_1$ and $S_2$, respectively, the above silica species (1) to (4) makes the $S_1/S_2$ ratio 0.2, 0.1, 0.05, and 0.02, respectively. The viscosity of the resulting pastes at 25° C. was 3300 poise, 3000 poise, 2900 poise, and 3200 poise, respectively, as measured with a rotating spindle viscometer. It is thus proved that a paste having a further reduced viscosity and thereby exhibiting excellent workability can be obtained when the $S_1/S_2$ ratio ranges from 0.02 to 0.2, particularly from 0.05 to 0.1.

According to the 10th embodiment of the present invention, a paste exhibiting excellent workability in filling operation can be obtained. A first cured resin obtained from this paste exhibits excellent adhesion to a copper deposit layer formed thereon, causing no peeling or blisters of the copper deposit layer. Further, the shrinkage of the first cured resin in a solder reflow step can be suppressed to prevent crack development in a built-up layer. The 17th embodiment offers a convenient means for confirming the excellent performance of the paste of the 10th embodiment.

In the PWB according to the 18th embodiment, separation between the first cured resin and the copper deposit layer formed in and on the through-holes does not occur, and cracking in a built-up layer and the second cured resin can be prevented. Therefore, it is easy to increase the wiring density and to increase the number of wiring layers.

EXAMPLES 12 TO 15 AND COMPARATIVE EXAMPLES 10 TO 13

1) Preparation of Paste:

A paste for filling -through-holes was prepared by mixing 100 parts of an epoxy resin composition consisting of 95 parts of the epoxy resin shown in Table 4 below and 5 parts of an imidazole curing agent 2E4MZ-CN with the inorganic filler or the inorganic/metallic mixed filler as shown in Table 4. The epoxy resins and fillers used were as follows.

(a) Epoxy resin
(1) Trifunctional amine type epoxy resin (triglycidyl-p-aminophenol; E-152, produced by Yuka Shell K.K.), referred to as AP in Table 4.
(2) Bifunctional amine type epoxy resin (diglycidylaniline; GAN, produced by Nippon Kayaku Co., Ltd.), referred to as AN in Table 4.
(3) Phenol novolak epoxy resin (E-152, produced by Yuka Shell Epoxy K.K.), referred to as PN in Table 4.
(4) Bisphenol A epoxy resin (E-828, produced by Yuka Shell Epoxy K.K.), referred to as BPA in Table 4.
(5) Bisphenol F epoxy resin (E-807, produced by Yuka Shell Epoxy K.K.), referred to as BPF in Table 4.
(6) 1,6-Hexanediol diglycidyl -ether (YED216, produced by Yuka Shell Epoxy K.K.), referred to 16H in Table 4.

(b) Inorganic Filler
(1) Spherical silica having an average particle size of 2 μm (SO-E5, produced by Tatsumori Ltd.), referred to as S16 in Table 4.
(2) Spherical silica having an average particle size of 0.5 μm (SO-E2, produced by Tatsumori Ltd.), referred to as S05 in Table 4.

(c) Metallic filler
(1) Spherical copper powder having an average particle size of 10 μm (SFR-CU, produced by Nippon Atomized Metal Powders Corporation), referred to as C10 in Table 4.

2) Viscosity of Paste and Water Absorption and Shrinkage Percentage of Curing Product:

The viscosity (25° C.) of the paste prepared above, the water absorption of the first cured resin of the paste, and the shrinkage percentage of the first cured resin in a solder reflow step were measured in the same manner as in Example 1.

3) Workability in Filling Through-holes and Cracking in Cured Resin:

Through-holes of a PWB were filled with the paste prepared above by screen printing. After curing the resin by heating at 150° C. for 5 hours in air, the state of the cured resin filling the through-holes was observed with the naked eye. For the samples in which the cured resin in through-holes were in a satisfactory state, an ML-PWB was prepared from the PWB. The ML-PWB was passed through a solder reflow oven set at 260° C. for 10 minutes, and development of any crack was observed with the naked eye. The results obtained are shown in Table 4.

TABLE 4

|  |  | Epoxy Resin (part) | Filler (part) | Viscosity (poise) | Water Absorption (%) | Shrinkage Percentage (%) | State of Cured Resin | Cracking |
|---|---|---|---|---|---|---|---|---|
| Example | 12 | AP(100) | S16(180) | 1800 | 1.30 | 0.08 | good | not observed |
|  | 13 | AP(50) + PN(50) | S16(150) | 3100 | 0.99 | 0.08 | " | not observed |
|  | 14 | AN(10) + PN(90) | " | 4800 | 0.82 | 0.06 | " | not observed |
|  | 15 | AP(30) + BPA(70) | S05(45) + C10(900) | 2500 | 0.15 | <0.01 | " | not observed |
| Compara. Example | 10 | BPF(100) | S16(180) | 2000 | 0.69 | 0.24 | " | observed |
|  | 11 | PN(100) | S16(150) | 23000 | 0.71 | 0.05 | partly no good | not tested |
|  | 12 | PN(90) + 16H(10) | " | 3500 | 0.75 | 0.17 | good | observed |
|  | 13 | PBA(100) | S05(45) + C10(900) | 16000 | 0.12 | <0.01 | partly no good | not tested |

As can be seen from the results in Table 4, Examples 12 to 15 according to the 19th embodiment of the present invention provide pastes of excellent performance, showing a low viscosity, a small water absorption, and a low shrinkage percentage. The pastes of Examples 12 to 13 and 15, which correspond to the 20th and 21st embodiments, have a particularly low viscosity. In Examples 12 to 15, the paste as stuffed and cured in the through-holes was in a good state, and no cracks was observed. In Example 15 in which AP and BPA are used in a weight ratio of 70:30, and spherical silica and spherical copper powder are used in appropriate amounts, the paste is particularly superior in viscosity and shrinkage resistance.

Comparative Example 10 using BPF alone as an epoxy resin shows a higher shrinkage percentage and develops cracks in the cured resin. Comparative Example 11 using PN alone shows a low shrinkage percentage but has a high viscosity to cause resin starvation in parts. In Comparative Example 12 in which PN is used in combination with a small amount of 16H generally used as a reactive diluent, while the viscosity decreases to improve filling properties, the shrinkage percentage is high to cause cracking. Comparative Example 13 using BPA alone has a high viscosity to cause resin starvation in some through-holes. Incidentally, the extremely small water absorption shown in Example 15 and Comparative Example 13 is ascribed to the weight of the spherical copper powder incorporated in a large quantity, which decreases the apparent value as calculated.

According to the 19th embodiment, a paste having a low viscosity and thereby exhibiting excellent workability in filling through-holes to cause no resin starvation can be obtained. The lengthwise shrinkage of the cured resin of the paste stuffed in through-holes is so small that development of cracks in a built-up layer can be suppressed sufficiently.

EXAMPLE 16

A paste for filling through-holes was prepared by mixing (A) 40 parts of an epoxy resin composition consisting of (1) 87 parts of a phenol novolak epoxy resin (E-152), (2) 8 parts of a bisphenol A epoxy resin (E-819), and 5 parts of an imidazole curing agent (2E4MZ-CN) and (B) 60 parts of spherical silica having an average particle size of 5 μm (PLV-61, produced by Tatsumori Ltd.). The proportion of the epoxy resin (2) was about 8.4 parts per 100 parts of the total amount of (1) and (2). The viscosity of the resulting paste at 25° C. was measured with a rotating spindle viscometer.

A test piece (20 mm L×5 mm W) was prepared from the paste and subjected to thermomechanical analysis in the same manner as in Example 1. The Tg of the epoxy resin composition, the coefficient of thermal expansion (hereinafter abbreviated as CTE) of the test piece in a temperature range of 0 to 70° C., and shrinkage percentage of the test piece were read from the resulting TMA curve. The Tg was obtained as a point of inflection in temperature rise, and the CTE was obtained as a slope of the TMA curve (change in length with temperature rise) from 0 to 70° C. The shrinkage percentage was obtained in the same manner as in Example 1.

An ML-PWB was prepared by using the paste. When the ML-PWB was passed through a solder reflow oven set at 270° C. for 10 minutes, no cracks developed in the built-up layer.

EXAMPLE 17

A paste was prepared in the same manner as in Example 16, except for using 30 parts of the epoxy resin composition and 70 parts of the spherical silica. The resulting paste was evaluated in the same manner as in Example 16.

When an ML-PWB prepared by using the paste was passed through a solder reflow oven set at 270° C. for 10 minutes, no cracks developed in the built-up layer.

EXAMPLE 18

A paste was prepared in the same manner as in Example 16, except for using 25 parts of the epoxy resin composition and 75 parts of the spherical silica. The resulting paste was evaluated in the same manner as in Example 16.

When an ML-PWB prepared by using the paste was passed through a solder reflow oven set at 270° C. for 10 minutes, no cracks developed in the built-up layer.

EXAMPLE 19

A paste was prepared in the same manner as in Example 16, except for using 15 parts of the epoxy resin composition and 85 parts of the spherical silica. The resulting paste was evaluated in the same manner as in Example 16.

When an ML-PWB prepared by-using the paste was passed through a solder reflow oven set at 270° C. for 10 minutes, no cracks developed in the built-up layer.

EXAMPLE 20

A paste was prepared in the same manner as in Example 16, except for using an epoxy resin composition consisting of (1) 76 parts of a phenol novolak epoxy resin (E-152), (2) 19 parts of a bisphenol A epoxy resin (E-828), and 5 parts of an imidazole curing agent (2E4MZ-CN). The proportion of the epoxy resin (2) was 20 parts per 100 parts of the total amount of (1) and (2). The resulting paste was evaluated in the same manner as in Example 16.

When an ML-PWB prepared by using the paste was passed through a solder reflow oven set at 270° C. for 10 minutes, no cracks developed in the built-up layer.

EXAMPLE 21

A paste was prepared in the same manner as in Example 16, except for using an epoxy resin composition consisting of (1) 87 parts of a phenol novolak epoxy resin (E-152), (2) 8 parts of a bisphenol F epoxy resin (E-806), and 5 parts of an imidazole curing agent (2E4MZ-CN). The proportion of the epoxy resin (2) was about 8.4 parts per 100 parts of the total amount of (1) and (2). The resulting paste was evaluated in the same manner as in Example 16.

When an ML-PWB prepared by using the paste was passed through a solder reflow oven set at 270° C. for 10 minutes, no cracks developed in the built-up layer.

EXAMPLE 22

A paste was prepared in the same manner as in Example 16, except for using an epoxy resin composition consisting of (1) 76 parts of an o-cresol novolak epoxy resin (EOCN-4400, produced by Nippon Kayaku Co., Ltd.), (2) 19 parts of a bisphenol A epoxy resin (E-819), and 5 parts of an imidazole curing agent (2E4MZ-CN). The proportion of the epoxy resin (2) was 20 parts per 100 parts of the total amount of (1) and (2). The resulting paste was evaluated in the same manner as in Example 16.

When an ML-PWB prepared by using the paste was passed through a solder reflow oven set at 270° C. for 10 minutes, no cracks developed in the built-up layer.

COMPARATIVE EXAMPLE 14

A paste was prepared in the same manner as in Example 16, except for using 60 parts of the epoxy resin composition and 40 parts of the spherical silica. The resulting paste was evaluated in the same manner as in Example 16.

When an ML-PWB prepared by using the paste was passed through a solder reflow oven set at 270° C. for 10 minutes, cracks developed in the built-up layer.

COMPARATIVE EXAMPLE 15

A paste was prepared in the same manner as in Example 16, except for using 45 parts of the epoxy resin composition and 55 parts of the spherical silica. The resulting paste was evaluated in the same manner as in Example 16.

When an ML-PWB prepared by using the paste was passed through a solder reflow oven set at 270° C. for 10 minutes, cracks developed in the built-up layer.

COMPARATIVE EXAMPLE 16

A paste was prepared in the same manner as in Example 16, except for using an epoxy resin composition consisting of 95 parts of a bisphenol A epoxy resin (E-828) and 5 parts of an imidazole curing agent (2E4MZ-CN). The resulting paste was evaluated in the same manner as in Example 16.

When an ML-PWB prepared by using the paste was passed through a solder reflow oven set at 270° C. for 10 minutes, cracks developed in the built-up layer.

COMPARATIVE EXAMPLE 17

A paste was prepared in the same manner as in Example 16, except for using 30 parts of an epoxy resin composition consisting of 95 parts of a bisphenol F epoxy resin (E-807) and 5 parts of an imidazole curing agent (2E4MZ-CN) and 70 parts of spherical silica. The resulting paste was evaluated in the same manner as in Example 16.

When an ML-PWB prepared by using the paste was passed through a solder reflow oven set at 270° C. for 10 minutes, cracks developed in the built-up layer.

COMPARATIVE EXAMPLE 18

A paste was prepared in the same manner as in Example 16, except for using an epoxy resin composition consisting of 95 parts of a bisphenol F epoxy resin (E-807) and 5 parts of an imidazole curing agent (2E4MZ-CN). The resulting paste was evaluated in the same manner as in Example 16.

When an ML-PWB prepared by using the paste was passed through a solder reflow oven set at 270° C. for 10 minutes, cracks developed in the built-up layer.

COMPARATIVE EXAMPLE 19

A paste was prepared in the same manner as in Example 16, except for using 60 parts of an epoxy resin composition consisting of 95 parts of a bisphenol F epoxy resin (E-807) and 5 parts of an imidazole curing agent (2E4MZ-CN) and 40 parts of spherical silica. The resulting paste was evaluated in the same manner as in Example 16.

When an ML-PWB prepared by using the paste was passed through a solder reflow oven set at 270° C. for 10 minutes, cracks developed in the built-up layer.

REFERENCE EXAMPLE

An ML-PWB was prepared in the same manner as in Comparative Example 19, except that the paste in the through-holes was heated at 180° C. for 10 hours to produce a first cured resin. When the resulting ML-PWB was passed through a solder reflow oven set at 270° C. for 10 minutes, no cracks developed in the built-up layer owing to the high heating temperature in the filling step. However, when the ML-PWB was subjected to a cycling test according to Military specifications (MIL) in a simulation of the service environment (883C, Condition B; 500 thermal cycles between −55° C. and +125° C.), cracks developed in the second cured resin in the through-holes.

The results of measurements and evaluation made in Examples 16 to 22 and Comparative Examples 14 to 19 are shown in Tables 5 and 6 below, in which resin (a) is a novolak epoxy resin, and resin (b) is a bisphenol epoxy resin.

TABLE 5

| Example No. | Composition of Paste (wt %) | | | | Viscosity (poise) | Tg (° C.) | CTE (ppm) | Shrinkage Percentage (%) | Crack Development |
|---|---|---|---|---|---|---|---|---|---|
| | Resin (a) | Resin (b) | (a) + (b): silica | Curing Agent | | | | | |
| 16 | E-152 (87%) | E-819 (8%) | 40:60 | imidazole (5%) | 3500 | 145 | 43 | 0.08 | not observed |
| 17 | E-152 (87%) | E-819 (8%) | 30:70 | imidazole (5%) | 7000 | " | 29 | 0.06 | not observed |
| 18 | E-152 (87%) | E-819 (8%) | 25:75 | imidazole (5%) | 10000 | " | 23 | 0.026 | not observed |
| 19 | E-152 (87%) | E-819 (8%) | 15:85 | imidazole (5%) | 30000 | " | 18 | 0.009 | not observed |
| 20 | E-152 (76%) | E-828 (19%) | 40:60 | imidazole (5%) | 3100 | 140 | 39 | 0.085 | not observed |
| 21 | E-152 (87%) | E-806 (8%) | " | imidazole (5%) | 3000 | 145 | 41 | 0.10 | not observed |
| 22 | CN4400 (76%) | E-819 (19%) | " | imidazole (5%) | 4500 | 155 | 42 | 0.07 | not observed |

TABLE 6

| Compara. Example No. | Resin (a) | Resin (b) | (a) + (b): silica | Curing Agent | Viscosity (poise) | Tg (° C.) | CTE (ppm) | Shrinkage Percentage (%) | Crack Development |
|---|---|---|---|---|---|---|---|---|---|
| 14 | E-152 (87%) | E-819 (8%) | 60:40 | imidazole (5%) | 1500 | 145 | 51 | 0.20 | observed |
| 15 | E-152 (87%) | E-819 (8%) | 45:55 | imidazole (5%) | 3000 | " | 49 | 0.12 | " |
| 16 | — | E-828 (95%) | 40:60 | imidazole (5%) | 2200 | 135 | 40 | 0.18 | " |
| 17 | — | E-807 (95%) | 30:70 | imidazole (5%) | 2100 | 130 | 27 | 0.20 | " |
| 18 | — | E-807 (95%) | 40:60 | imidazole (5%) | 490 | " | 42 | 0.33 | " |
| 19 | — | E-807 (95%) | 60:40 | imidazole (5%) | 140 | " | 61 | 0.42 | " |

The results in Table 5 reveal that the shrinkage percentage appreciably decreases with an increase in the proportion of spherical silica in the paste (Examples 16 to 19). Comparison between Examples 20 and 21 differing in the ratio of the bisphenol epoxy resin (b) to the novolak epoxy resin (a) shows that the shrinkage percentage is lower in Example 20 having a higher (b) to (a) ratio. Example 22, in which a novolak epoxy resin different from that used in Example 20 is used, achieves a low shrinkage percentage on the same level as in Example 20. While CTE widely varies from 18 to 43 ppm in Examples 16 to 22, it is seen that the difference in CTE has no influence on the shrinkage percentage.

As is shown in Table 6, the shrinkage percentage is as high as 0.20% in Comparative Example 14 in which the same epoxy resins as used in Examples 16 to 19 are used but the proportion of spherical silica is 40 parts. The shrinkage percentage is decreased by using 55 parts of spherical silica (Comparative Example 15) but is still higher than the level achieved in Examples. In Comparative Example 17 wherein 70 parts of spherical silica is used but no novolak epoxy resin is present, the shrinkage percentage is considerably high. As the proportion of spherical silica is decreased in Comparative Example 17 (Comparative Examples 18 and 19), the viscosity largely falls, and the shrinkage percentage steeply rises. In Comparative Example 16 which is the same as Comparative Example 18 in proportion of spherical silica but different in kind of the bisphenol epoxy resin used, a considerable reduction of the shrinkage percentage is observed.

According to the 26th embodiment, a paste which suppresses crack development in a built-up layer can be obtained by specifying the shrinkage percentage of a first cured resin of the paste in the longitudinal direction of through-holes in a solder reflow step. With the heating temperatures in a filling step and a solder reflow step specified according to the 27th embodiment, and with the composition of the paste specified according to the 28th embodiment, the paste is excellent in not only shrink-resistance properties but workability in filling through-holes, and a second cured resin of the paste in a PWB does not suffer from cracks while equipment containing the PWB is in use. Further, the 30th embodiment provides a convenient means for identifying the paste of the 26th embodiment.

According to the 31st embodiment there is provided a PWB suffering no crack development in its built-up layer, and it is easy to increase the wiring density and to increase the number of wiring layers.

While the invention has been described in detail and with reference to specific examples thereof, it will be apparent to one skilled in the art that various changes and modifications can be made therein without departing from the spirit and scope thereof.

What is claimed is:

1. A paste for filling through-holes of a printed wiring board comprising:
    (A) 100 parts by weight of an epoxy resin composition containing 90 to 99.5 parts by weight of an epoxy resin and 0.5 to 10 parts by weight of a curing agent; and
    (B) 500 to 1000 parts by weight of a metallic filler having an average particle size of 0.5 to 20 $\mu$m;
        wherein the paste has a viscosity of not higher than 20,000 poise at 25° C. and a volatile content of not more than 1.0% when heated in a filling step; and
        the paste exhibiting such shrink-resistance properties that when a first cured resin obtained by heating in a filling step is re-heated and cooled in a solder reflow step to obtain a second cured resin, the shrinkage percentage of said first cured resin to said second cured resin in the longitudinal direction of the through-hole being not greater than 0.1%.

2. The paste according to claim 1, wherein said metallic filler is spherical copper particles having been subjected to a blackening treatment.

3. The paste according to claim 1, wherein said metallic filler has been treated with a silane coupling agent having an epoxy group.

4. The paste according to claim 1, wherein said epoxy resin comprises (1) 70 to 99 parts by weight of a phenol novolak epoxy resin and (2) 1 to 30 parts by weight of at least one of a bisphenol A epoxy resin and a bisphenol F epoxy resin per 100 parts by weight of the total amount of (1) and (2).

5. The paste according to claim 1, wherein the heating temperature in the filling step is 120 to 170° C., and the heating temperature in the solder reflow step is 230 to 280° C.

6. The paste according to claim 1, wherein a copper deposit layer formed on the first cured resin by electroplating has a peel strength of not less than 0.8 kgf/cm$^2$ as measured in accordance with JIS C 6481.

7. The paste according to claim 1, wherein the first cured resin has a water absorption of not more than 0.3%.

8. A paste for filling through-holes of a printed wiring board comprising:
    (A) 100 parts by weight of an epoxy resin composition comprising 90 to 99.5 parts by weight of an epoxy resin and 0.5 to 10 parts by weight of a curing agent; and (B) 500 to 1000 parts by weight of a metallic filler having an average particle size of 0.5 to 20 μm;

wherein the paste having a viscosity of not higher than 20,000 poise at 25° C. and a volatile content of not more than 1.0% when heated in a filling step; and the paste exhibits such shrink-resistance properties that when a 5-mm wide test piece which is prepared by making a 100 μm-thick film of the paste and curing the film by heating at 150° C. for 5 hours is heated at a starting temperature of 23° C. up to 270° C. and then cooled to 23° C. under a load of 5 g applied in the longitudinal direction of the test piece, the shrinkage percentage of the test piece in the longitudinal direction is not greater than 0.1%, the shrinkage percentage being calculated according to equation:

Shrinkage percentage (%)=[(length of test piece at 23° C. before being heated to 270° C.)−(length of test piece after being once heated to 270° C. and then cooled to 23° C.)]/(length of test piece at 23° C. before being heated to 270° C.)×100.

9. A printed wiring board having through-holes filled with a heat-curing product of a paste according to any one of claims 1 to 8.

10. A paste for filling through-holes of a printed wiring board comprising:

(A) 100 parts by weight of an epoxy resin composition containing 90 to 99.5 parts by weight of an epoxy resin and 0.5 to 10 parts by weight of a curing agent;

(B) 100 to 1000 parts by weight of a metallic filler; and (C) 10 to 900 parts by weight of an inorganic filler;

wherein the paste having a viscosity of not higher than 20,000 poise at 25° C. and a volatile content of not more than 1.0% when heated in a filling step; and the paste exhibits such shrink-resistance properties that when a first cured resin obtained by heating in a filling step is re-heated and cooled in a solder reflow step to obtain a second cured resin, the shrinkage percentage of the first cured resin to the second cured resin in the longitudinal direction of the through-hole is not greater than 0.1%.

11. The paste according to claim 10, wherein said metallic filler has an average particle size of 1 to 20 μm.

12. The paste according to claim 10, wherein said inorganic filler has an average particle size of 0.1 to 10 μm.

13. The paste according to claim 10, wherein the ratio of the average particle size of the inorganic filler $S_1$ to the average particle size of the metallic filler $S_2$, i.e., $S_1/S_2$, is 0.02 to 0.5.

14. The paste according to claim 10, wherein at least one of said metallic fillet and said inorganic filler is spherical.

15. The paste according to claim 10, wherein said epoxy resin comprises (1) a phenol novolak epoxy resin and (2) at least one of a bisphenol A epoxy resin and a bisphenol F epoxy resin, the proportion of said phenol novolak epoxy resin being not less than 70 parts by weight per 100 parts by weight of the total amount of (1) and (2).

16. The paste according to claim 10, wherein the heating temperature in the filling step is 120 to 170° C., and the heating temperature in the solder reflow step is 230 to 280° C.

17. A paste for filling through-holes of a printed wiring board comprising:

(A) 100 parts by weight of an epoxy resin composition containing 90 to 99.5 parts by weight of an epoxy resin and 0.5 to 10 parts by weight of a curing agent;

(B) 100 to 1000 parts by weight of a metallic filler; and (C) 10 to 900 parts by weight of an inorganic filler;

wherein the paste having a viscosity of not higher than 20,000 poise at 25° C. and a volatile content of not more than 1.0% when heated in a filling step, and the paste exhibits such shrink-resistance properties that when a 5-mm wide test piece which is prepared by making a 100 μm-thick film of the paste and curing the film by heating at 150° C. for 5 hours is heated at a starting temperature of 23° C. up to 270° C. and then cooled to 23° C. under a load of 5 g applied in the longitudinal direction of the test piece, the shrinkage percentage of the test piece in the longitudinal direction is not greater than 0.1%, the shrinkage percentage being calculated according to equation:

Shrinkage percentage (%)=[(length of test piece at 23° C. before being heated to 270° C.)−(length of test piece after being once heated to 270° C. and then cooled to 23° C.)]/(length of test piece at 23° C. before being heated to 270° C.)×100.

18. A printed wiring board having through-holes filled with a heat-curing product of a paste according to any one of claims 10 to 17.

19. A paste for filling through-holes of a printed wiring board comprising:

(A) an epoxy resin composition comprising an epoxy resin and a curing agent;

(B) a filler; and (C) a volatile content of not more than 1.0% when heated in a filling step;

wherein the epoxy resin contains an amine type epoxy resin.

20. The paste according to claim 19, wherein said amine type epoxy resin is a trifunctional epoxy resin which is liquid at ambient temperature.

21. The paste according to claim 19, wherein said amine type epoxy resin is triglycidyl-p-aminophenol.

22. The paste according to claim 19, wherein said epoxy resin further contains at least one of a phenol novolak epoxy resin and a bisphenol A epoxy resin.

23. The paste according to claim 19, wherein the paste has a viscosity of not higher than 10,000 poise at 25° C. and has such shrink-resistance properties that when a first cured resin obtained by heating in a filling step is re-heated and cooled in a solder reflow step to obtain a second cured resin, the shrinkage percentage of the first cured resin to the second cured resin in the longitudinal direction of the through-hole being not greater than 0.1%.

24. The paste according to claim 19, wherein said curing agent is an imidazole curing agent.

25. The paste according to claim 19, wherein said filler is an inorganic filler, a metallic filler or a mixture thereof.

26. A paste for filling through-holes of a printed wiring board which has such shrink-resistance properties that when a first cured product thereof obtained by heating in a filling step is re-heated and cooled in a solder reflow step to obtain a second cured product, the shrinkage percentage of the first cured product to the second cured product in the longitudinal direction of the through-hole being not greater than 0.1%.

27. The paste according to claim 26, wherein the paste comprises (A) an epoxy resin composition and (B) an inorganic filler, and the heating temperature in the filling step is 120 to 170° C. and that in the solder reflow step is 230 to 280° C.

28. The paste according to claim 27, comprising (A) 10 to 40 parts by weight of an epoxy resin composition and (B) 60 to 90 parts by weight of an inorganic filler, the epoxy resin composition containing (1) 70 to 99 parts by weight of at least one of a phenol novolak epoxy resin and a cresol novolak epoxy resin and (2) 1 to 30 parts by weight of at least one of a bisphenol A epoxy resin and a bisphenol F epoxy resin per 100 parts by weight of the total amount of (1) and (2).

29. The paste according to claim 27, comprising (A) 10 to 30 parts by weight of the epoxy resin composition and (B) 60 to 90 parts by weight of the inorganic filler.

30. A paste for filling through-holes of a printed wiring board which has such shrink-resistance properties that when a 5-mm wide test piece which is prepared by making a 100 μm-thick film of the paste and curing the film by heating at 150° C. for 5 hours is heated at a starting temperature of 23° C. up to 270° C. and then cooled to 23° C. under a load of 5 g applied in the longitudinal direction of the test piece, the shrinkage percentage of the test piece in the longitudinal direction is not greater than −0.1%, the shrinkage percentage being calculated according to equation:

Shrinkage percentage (%)=[(length of test piece at 23° C. before being heated to 270° C.)−(length of test piece after being once heated to 270° C. and then cooled to 23° C.)]/(length of test piece at 23° C. before being heated to 270° C.)×100.

31. A printed wiring board having through-holes filled with a heat-curing product of a paste according to any one of claims 26 to 30.

32. A paste for filling through-holes of a printed wiring board comprising (A) an epoxy resin composition comprising an epoxy resin and a curing agent; and (B) a filler; and wherein the epoxy resin contains an amine type epoxy resin and the curing agent is a catalyst curing agent.

* * * * *